United States Patent
Park

(10) Patent No.: US 11,800,737 B2
(45) Date of Patent: Oct. 24, 2023

(54) PROTECTIVE FILM, MANUFACTURING METHOD THEREOF, AND METHOD OF MANUFACTURING DISPLAY DEVICE USING THE SAME

(71) Applicant: Samsung Display Co., Ltd., Yongin-si (KR)

(72) Inventor: Sungjune Park, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 649 days.

(21) Appl. No.: 16/595,736

(22) Filed: Oct. 8, 2019

(65) Prior Publication Data
US 2020/0227677 A1  Jul. 16, 2020

(30) Foreign Application Priority Data
Jan. 11, 2019  (KR) .................... 10-2019-0004001

(51) Int. Cl.
*H10K 50/844* (2023.01)
*G02B 1/14* (2015.01)
(Continued)

(52) U.S. Cl.
CPC ............ *H10K 50/844* (2023.02); *B32B 7/06* (2013.01); *B32B 7/12* (2013.01); *B32B 27/08* (2013.01);
(Continued)

(58) Field of Classification Search
CPC ...... B32B 7/00–7/14; B32B 3/10; B32B 3/18; H01L 51/00–51/56; G06F 1/16–1/1683
See application file for complete search history.

(56) References Cited

U.S. PATENT DOCUMENTS

| | | | |
|---|---|---|---|
| 8,951,084 | B2 | 2/2015 | Kwon et al. |
| 9,627,235 | B2 | 4/2017 | Iwata et al. |
| 10,986,744 | B2 | 4/2021 | Yeum et al. |
| 2003/0107807 | A1 | 6/2003 | Saiki et al. |

(Continued)

FOREIGN PATENT DOCUMENTS

| | | |
|---|---|---|
| KR | 1020130002124 A | 1/2013 |
| KR | 20140120315 A | 10/2014 |

(Continued)

OTHER PUBLICATIONS

Machine translation of WO 2013/114583. Retrieved Apr. 29, 2022.*
European Search Report for European Patent Application No. 20150161.6 dated May 27, 2020.

*Primary Examiner* — Prashant J Khatri
(74) *Attorney, Agent, or Firm* — CANTOR COLBURN LLP

(57) ABSTRACT

A protective film includes a first film, a second film, and a panel protective film disposed between the first film and the second film. The panel protective film includes a first portion and a second portion spaced apart from each other along a first direction. The first portion includes a first side and a second side opposite to each other along the first direction, a third side and a fourth side opposite to each other along a second direction crossing the first direction, and a first curvilinear portion connecting the second side to the fourth side, the first curvilinear portion corresponding to first respective corners of the first film and the second film and having a curved shape. The first side faces the second portion, and the first curvilinear portion is disposed inside edges of the first film and the second film at the first respective corners thereof.

11 Claims, 19 Drawing Sheets

(51) Int. Cl.
*B32B 7/06* (2019.01)
*B32B 7/12* (2006.01)
*B32B 27/08* (2006.01)
*B32B 27/28* (2006.01)
*B32B 27/36* (2006.01)
*H10K 59/122* (2023.01)
*H10K 71/00* (2023.01)
*H10K 77/10* (2023.01)
*H10K 102/00* (2023.01)

(52) U.S. Cl.
CPC ............ *B32B 27/281* (2013.01); *B32B 27/36* (2013.01); *G02B 1/14* (2015.01); *H10K 59/122* (2023.02); *H10K 71/00* (2023.02); *H10K 77/111* (2023.02); *B32B 2457/206* (2013.01); *H10K 2102/321* (2023.02)

(56) References Cited

U.S. PATENT DOCUMENTS

| | | |
|---|---|---|
| 2012/0070607 A1 | 3/2012 | Yu et al. |
| 2018/0011514 A1 | 1/2018 | Yoo et al. |
| 2018/0013095 A1 | 1/2018 | Choi et al. |
| 2018/0178493 A1 | 6/2018 | Fujioka et al. |
| 2019/0013487 A1 | 1/2019 | Park et al. |

FOREIGN PATENT DOCUMENTS

| | | |
|---|---|---|
| KR | 1020150077854 A | 7/2015 |
| KR | 101669026 B1 * | 10/2016 |
| KR | 101811920 B1 | 12/2017 |
| KR | 20180051695 A | 5/2018 |
| KR | 101941448 A1 | 1/2019 |
| KR | 1020190005285 A | 1/2019 |
| WO | 0044841 A1 | 8/2000 |
| WO | 2013114583 A1 | 8/2013 |
| WO | 2014054781 A1 | 4/2014 |
| WO | 2015012014 A1 | 1/2015 |

* cited by examiner

PROTECTIVE FILM, MANUFACTURING METHOD THEREOF, AND METHOD OF MANUFACTURING DISPLAY DEVICE USING THE SAME

This application claims priority to Korean Patent Application No. 10-2019-0004001, filed on Jan. 11, 2019, and all the benefits accruing therefrom under 35 U.S.C. § 119, the entire contents of which are hereby incorporated by reference.

BACKGROUND

(1) Field

The present disclosure relates to a protective film, a manufacturing method thereof, and a method of manufacturing a display device using the same.

(2) Description of the Related Art

Electronic devices, such as a smart phone, a digital camera, a notebook computer, a navigation system, and a smart television, include a display device for displaying an image to a user. The display device generates an image and provides the image to a user through a display surface.

With the development of display technologies, various display devices have been developed. One example of such display devices is a flexible display device that can be curvedly deformed, folded, or rolled. Since a shape of the flexible display device is variously changed, the use of the flexible display device allows for improvement in portability and user convenience.

SUMMARY

An embodiment of the invention provides a protective film for which first and second films disposed on and below a panel protective film, respectively, are detachable from the panel protective film, a method of manufacturing the same, and a method of manufacturing a display device using the same.

According to an embodiment of the invention, a protective film includes a first film, a second film, and a panel protective film disposed between the first film and the second film. The panel protective film includes a first portion and a second portion spaced apart from each other along a first direction. The first portion includes a first side and a second side opposite to each other along the first direction, a third side and a fourth side opposite to each other along a second direction crossing the first direction, and a first curvilinear portion connecting the second side to the fourth side, the first curvilinear portion corresponding to first respective corners of the first film and the second film and having a curved shape. The first side faces the second portion, and the first curvilinear portion is disposed inside edges of the first film and the second film at the first respective corners thereof.

According to an embodiment of the invention, a method of manufacturing a protective film includes preparing a protective film sheet including a first film, a panel protective film disposed on the first film, and a support film disposed below the first film, the panel protective film including a first dummy portion, a second dummy portion, a first protective film disposed between the first dummy portion and the second dummy portion, and a second protective film spaced apart from the first protective film with the second dummy portion interposed therebetween, removing the first and second dummy portions, which are spaced apart from each other in a first direction and are extended in a second direction crossing the first direction, providing a second film on the first and second protective films, a first groove defined by removing the first dummy portion, and a second groove defined by removing the second dummy portion, cutting the panel protective film and the first and second films along a border of a rectangular region including a first portion of the first protective film, a second portion of the second protective film, and an opening, which is defined as a part of the second groove and is disposed between the first and second portions, and removing the support film.

According to an embodiment of the invention, a method of manufacturing a display device includes disposing a protective film below a display panel, the protective film including a first film, a second film disposed below the first film, and a panel protective film disposed between the first film and the second film, removing the first film, attaching the panel protective film to a lower portion of the display panel, and removing the second film. The panel protective film includes a first portion and a second portion spaced apart from the first portion in a first direction. The first portion includes a first side and a second side opposite to each other along the first direction, a third side and a fourth side opposite to each other along a second direction crossing the first direction, and a first curvilinear portion connecting the second side to the fourth side, the first curvilinear portion corresponding to first respective corners of the first film and the second film and having a curved shape,

BRIEF DESCRIPTION OF THE DRAWINGS

Embodiments will be more clearly understood from the following brief description taken in conjunction with the accompanying drawings. The accompanying drawings represent non-limiting, embodiments as described herein.

Figure 1:
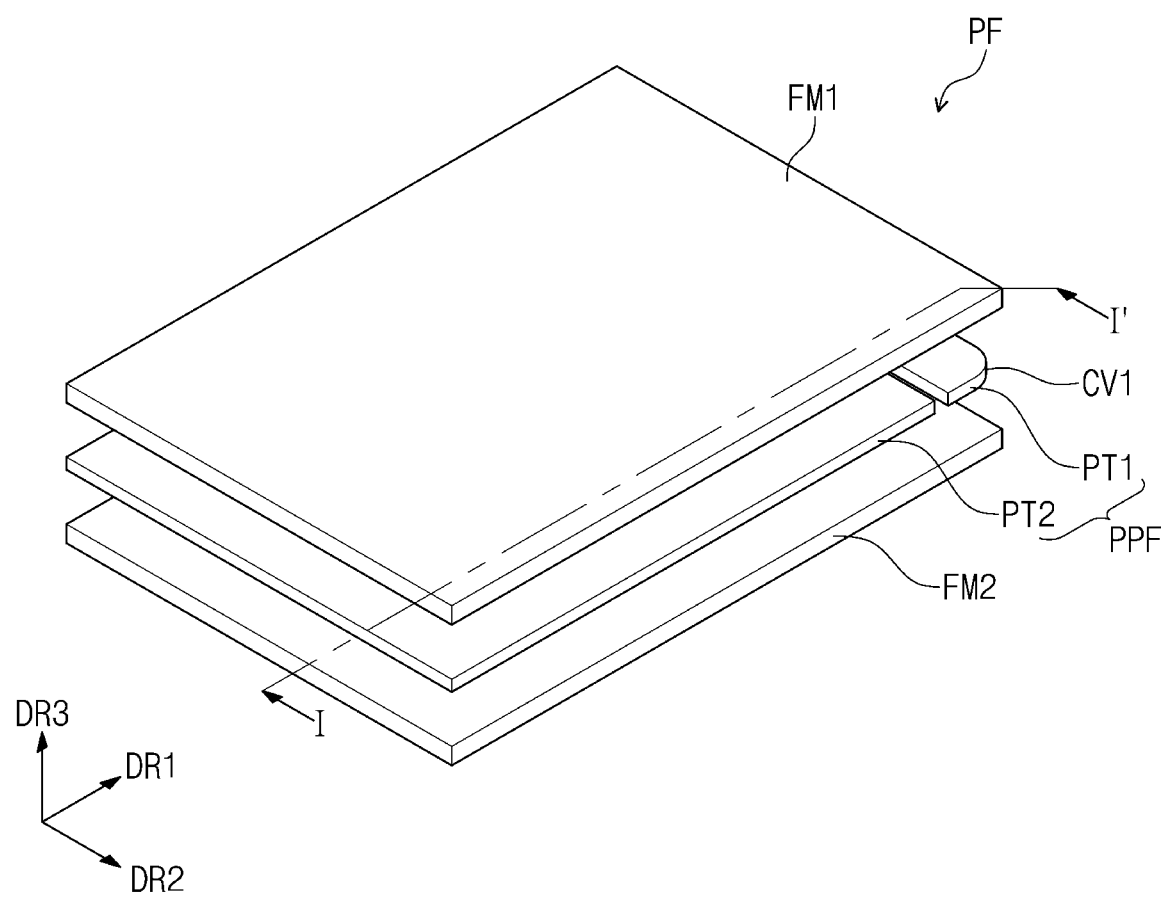
FIG. 1 is an exploded perspective view illustrating an embodiment of a protective film according to the invention.

It should be noted that these figures are intended to illustrate the general characteristics of methods, structure and/or materials utilized in certain embodiments and to supplement the written description provided below. These drawings are not, however, to scale and may not precisely reflect the precise structural or performance characteristics of any given embodiment, and should not be interpreted as defining or limiting the range of values or properties encompassed by embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Embodiments of the inventions will now be described more fully with reference to the accompanying drawings, in which embodiments are shown. Embodiments of the invention may, however, be embodied in many different forms and should not be construed as being limited to the embodiments set forth herein; rather, these embodiments are provided so that this disclosure will be thorough and complete, and will fully convey the embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being related to another element such as being "connected" or "coupled" to another element, it can be directly connected or coupled to the other element or intervening elements may be present. In contrast, when an element is referred to as being related to another element such as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of embodiments. As used herein, the singular forms "a," "an" and "the" are intended to include the plural forms as well, unless the context clearly indicates otherwise. "At least one" is not to be construed as limiting "a" or "an." "Or" means "and/or." As used herein the term "and/or" includes any and all combinations of one or more of the associated listed items. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which embodiments of the invention belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A flexible display device includes a flexible substrate and a plurality of pixels which are disposed on the flexible substrate. The flexible substrate may be vulnerable to an external impact or scratch, and thus, an additional protective film for protecting the flexible substrate may be disposed below the flexible substrate.

Figure 2:
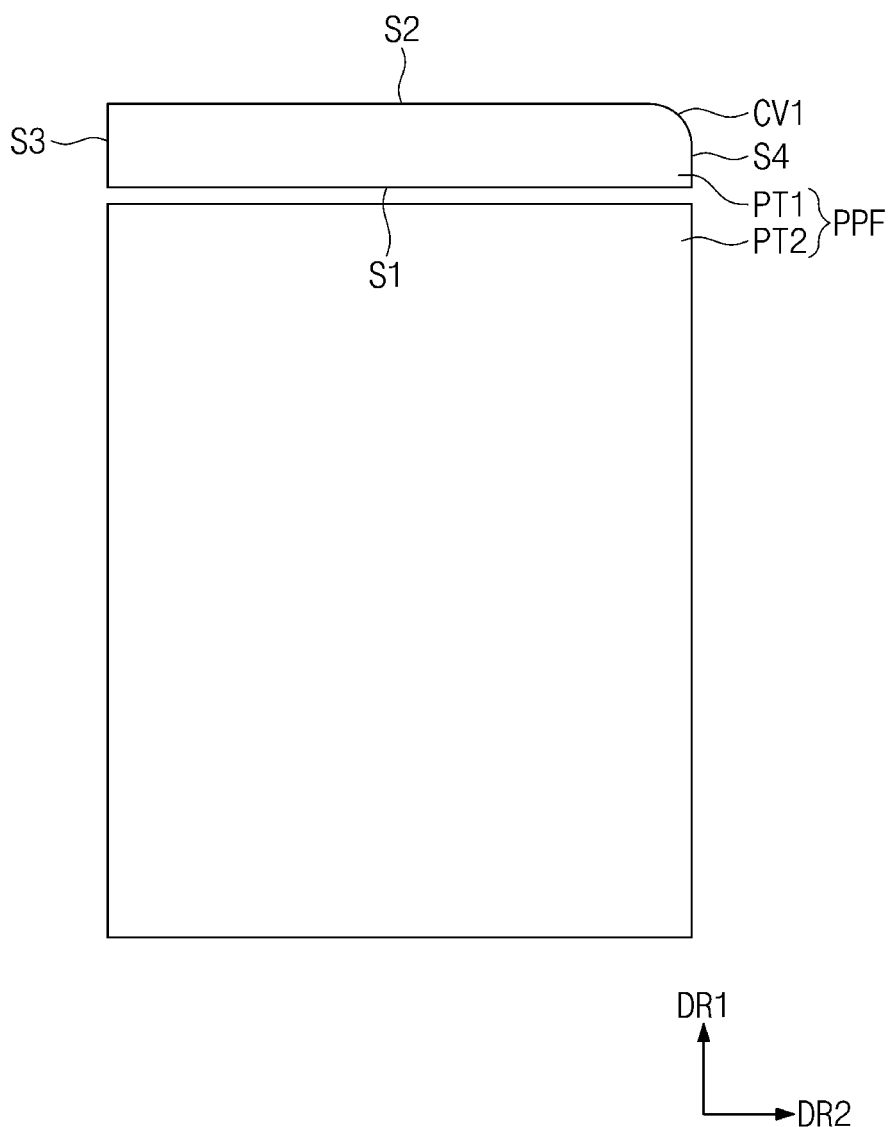
FIG. 2 is a top plan view illustrating a panel protective film shown in FIG. 1.

FIG. 1 is an exploded perspective view illustrating an embodiment of a protective film according to the invention. FIG. 2 is a top plan view illustrating a panel protective film shown in FIG. 1.

Referring to FIG. 1, a protective film PF includes a first film FM1, a second film FM2 facing the first film FM1, and a panel protective film PPF disposed between the first film FM1 and the second film FM2. The panel protective film PPF and the second film FM2 may be disposed below the first film FM1.

The first film FM1, the second film FM2, and the panel protective film PPF may have a rectangular shape, for which relatively long sides are parallel to a first direction DR1 and for which relatively short sides are parallel to a second direction DR2 which crosses the first direction DR1. In other words, the first film FM1, the second film FM2, and the panel protective film PPF may have a flat surface or planar shape disposed in a plane which is parallel to a plane defined by the first and second directions DR1 and DR2.

Hereinafter, a direction crossing both of the first and second directions DR1 and DR2 will be referred to as a third direction DR3. The third direction DR3 may be perpendicular to the first and second directions DR1 and DR2, without being limited thereto. Furthermore, as applicable to an entirety of the present disclosure, the expression "when viewed in a plan view" may mean that a mentioned structure is viewed along the third direction DR3. Hereinafter, a thickness of the protective film and/or a display device, along with respective components thereof, may be defined along the third direction DR3. The thickness may be defined as a distance between top and bottom surfaces of a component, without being limited thereto.

The first film FM1, the second film FM2, and the panel protective film PPF may each include polyimide ("PI") or polyethylene terephthalate ("PET"). When measured in the third direction DR3, a thickness of each of the first and second films FM1 and FM2 may be larger than a thickness of the panel protective film PPF.

The panel protective film PPF may include a first portion PT1 and a second portion PT2 which is spaced apart from the first portion PT1 along the first direction DR1. That is the first portion PT1 and the second portion PT2 may be completely detached from each other by being spaced apart from each other. The first portion PT1 may include a first curvilinear portion CV1. Vertices or corners of the first and second films FM1 and FM2 are disposed adjacent to the first curvilinear portion CV1. In a top plan view, edges of the first curvilinear portion CV1 may be disposed at an inner region, that is, inside or spaced apart from edges of the vertices of the first and second films FM1 and FM2.

Referring to FIG. 2, the first portion PT1 may be lengthwise elongated in the second direction DR2. The second portion PT2 may have an overall rectilinear shape, such as a rectangular shape, for which relatively long sides are parallel to the first direction DR1 and for which relatively short sides are parallel to the second direction DR2.

Edges of the first portion PT1 may include or be defined by a first side S1, a second side S2, a third side S3, a fourth side S4, and the first curvilinear portion CV1. The first side S1 and the second side S2 may be disposed to be opposite to each other along the first direction DR1. The first side S1 and the second side S2 may be lengthwise extended in the second direction DR2. The third side S3 and the fourth side S4 may be disposed to be opposite to each other along the second direction DR2. The third side S3 and the fourth side S4 may be lengthwise extended along the first direction DR1.

The first side S1 may be closest to and face the second portion PT2. The first curvilinear portion CV1 may connect the second side S2 to the fourth side S4. The first curvilinear portion CV1 may have a convexly curved shape. In an embodiment, for example, the first curvilinear portion CV1 may have a planar shape like a quarter of a circle. A connecting portion at which the first side S1 and the fourth side S4 meet, a connecting portion at which the first side S1 and the third side S3 meet, and a connecting portion at which the second side S2 and the third side S3 meet, may have a shape including a right angle.

Figure 3:
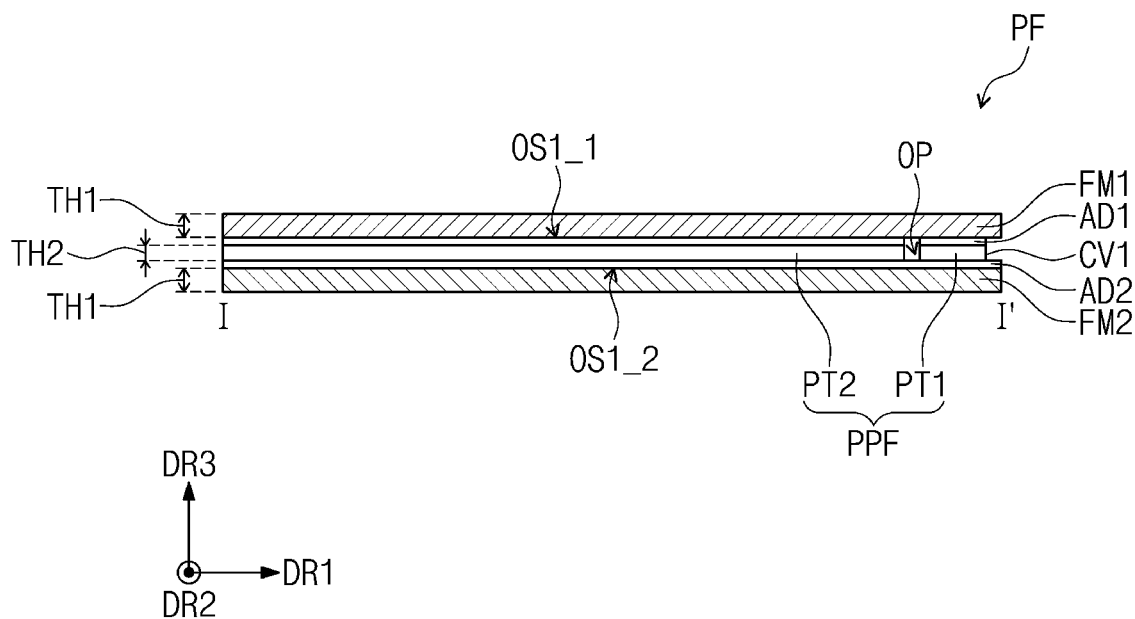
FIG. 3 is a cross-sectional view taken along line I-I' of FIG. 1.
Figure 4:
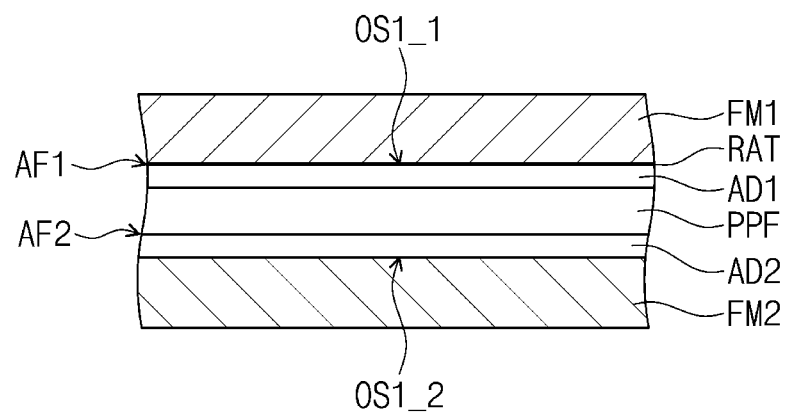
FIG. 4 is an enlarged cross-sectional view illustrating a region of the protective film shown in FIG. 3.

FIG. 3 is a cross-sectional view taken along line I-I' of FIG. 1. FIG. 4 is an enlarged cross-sectional view illustrating a region of the protective film shown in FIG. 3.

Referring to FIG. 3, the first film FM1 and the second film FM2 may have the same thickness as each other. In an embodiment, for example, each of the first film FM1 and second film FM2 may have a first thickness TH1, but the invention is not limited to this example. In an embodiment, for example, the first film FM1 and the second film FM2 may have different thicknesses from each other. The panel protective film PPF may have a second thickness TH2 that is smaller than the first thickness TH1. Each of the first portion PT1 and the second portion PT2 of the panel protective film PPF may have the second thickness TH2.

The first portion PT1 and the second portion PT2 may be spaced apart from each other, and an opening OP may be defined between the first portion PT1 and the second portion PT2 spaced apart from each other. A length of the opening OP may be extended along the second direction DR2.

The protective film PF may include a first adhesive agent AD1 disposed between the first film FM1 and the panel protective film PPF, and a second adhesive agent AD2 disposed between the second film FM2 and the panel protective film PPF. In an embodiment, a pressure sensitive adhesive may be used as the first and second adhesive agents AD1 and AD2, but the invention is not limited to this example. In an embodiment, for example, various adhesive materials or structures may be used as the first and second adhesive agents AD1 and AD2.

The first film FM1 and the panel protective film PPF may be removably attached to each other by the first adhesive agent AD1. The second film FM2 and the panel protective film PPF may be removably attached to each other by the second adhesive agent AD2.

Referring to FIG. 4, a first adhesion force at a first interface AF1 between the first film FM1 and the first adhesive agent AD1 may be weaker (e.g., smaller) than a second adhesion force at a second interface AF2 between the panel protective film PPF and the second adhesive agent AD2. Such a difference between the first adhesion force at the first interface AF1 and the second adhesion force at the second interface AF2 will be described in more detail below.

The protective film PF may further include a releasing agent RAT disposed between the first film FM1 and the first adhesive agent AD1. The first film FM1 with the releasing agent RAT may be collectively defined as a release film. The releasing agent RAT may be provided on a surface OS1_1 of the first film FM1 which faces the panel protective film PPF, such as by coating a releasing agent material. Since the releasing agent RAT is coated on the surface OS1_1 of the first film FM1, an adhesion strength between the first adhesive agent AD1 and the panel protective film PPF may be stronger (e.g., greater) than that between the first adhesive agent AD1 and the first film FM1.

The releasing agent RAT may include one of silicone-based releasing agents and fluorine-based releasing agents. As an example, the releasing agent RAT may include a silicon-based releasing agent. Owing to the releasing agent RAT, the first film FM1 may be detachable from the panel protective film PPF. In an embodiment, for example, the first film FM1 and the first adhesive agent AD1 may be easily separated from each other by the releasing agent RAT disposed therebetween.

The second adhesive agent AD2 may be provided on a surface OS1_2 of the second film FM2 which faces the panel protective film PPF, such as by coating a second adhesive agent material. In an embodiment of a method of manufacturing a protective film, a top surface of the second adhesive agent material provided on the surface OS1_2 of the second film FM2 may be hardened to form a hardened top surface of the second adhesive agent AD2, and the second film FM2 may be attached to the panel protective film PPF at the hardened top surface of the second adhesive agent AD2. A bottom surface of the of the second adhesive agent material, which forms a bottom surface of the second adhesive agent AD2, may not be hardened, but is not limited thereto.

An adhesion force of the bottom surface of the second adhesive agent AD2 may be stronger than an adhesion force of the hardened top surface of the second adhesive agent AD2. In an embodiment, for example, the second adhesive agent AD2 may be more strongly adhered to the second film FM2 than to the panel protective film PPF.

Referring back to FIG. 3, the first adhesive agent AD1 may be disposed between the first portion PT1 and the first film FM1 and between the second portion PT2 and the first film FM1. The first adhesive agent AD1 may not be disposed on the surface OS1_1 of the first film FM1 overlapped with the opening OP. That is, the first adhesive agent AD1 may include a first portion and a second portion respectively corresponding to the first portion PT1 and the second portion PT2 of the panel protective film PPF. The first adhesive agent AD1 may define an opening thereof corresponding to the opening OP of the panel protective film PPF. As applicable to an entirety of the present disclosure, element which are described as being related to each other as being "overlapped with" one another, may also be described as being "corresponding to" one another, such as in positional placement, location, extension, etc.

The second adhesive agent AD2 may be disposed between the first portion PT1 and the second film FM2 and between the second portion PT2 and the second film FM2. In addition, the second adhesive agent AD2 may be disposed on the surface OS1_2 of the second film FM2 overlapped with the opening OP.

In a top plan view, outer edges of the first curvilinear portion CV1 may be disposed inside outer edges of corresponding vertices or corners of the first film FM1 and the second film FM2. Thus, the outer edges of vertices of the first and second films FM1 and FM2 corresponding to the first curvilinear portion CV1 may be disposed outside the first curvilinear portion CV1 in the top plan view. Along the first direction DR1 in FIG. 3, for example, an outer edge of the first curvilinear portion CV1 at corresponding vertices of both the first film FM1 and the second film FM2 is spaced apart from an outer edge of the first film FM1 and the second film FM2.

Figure 5:
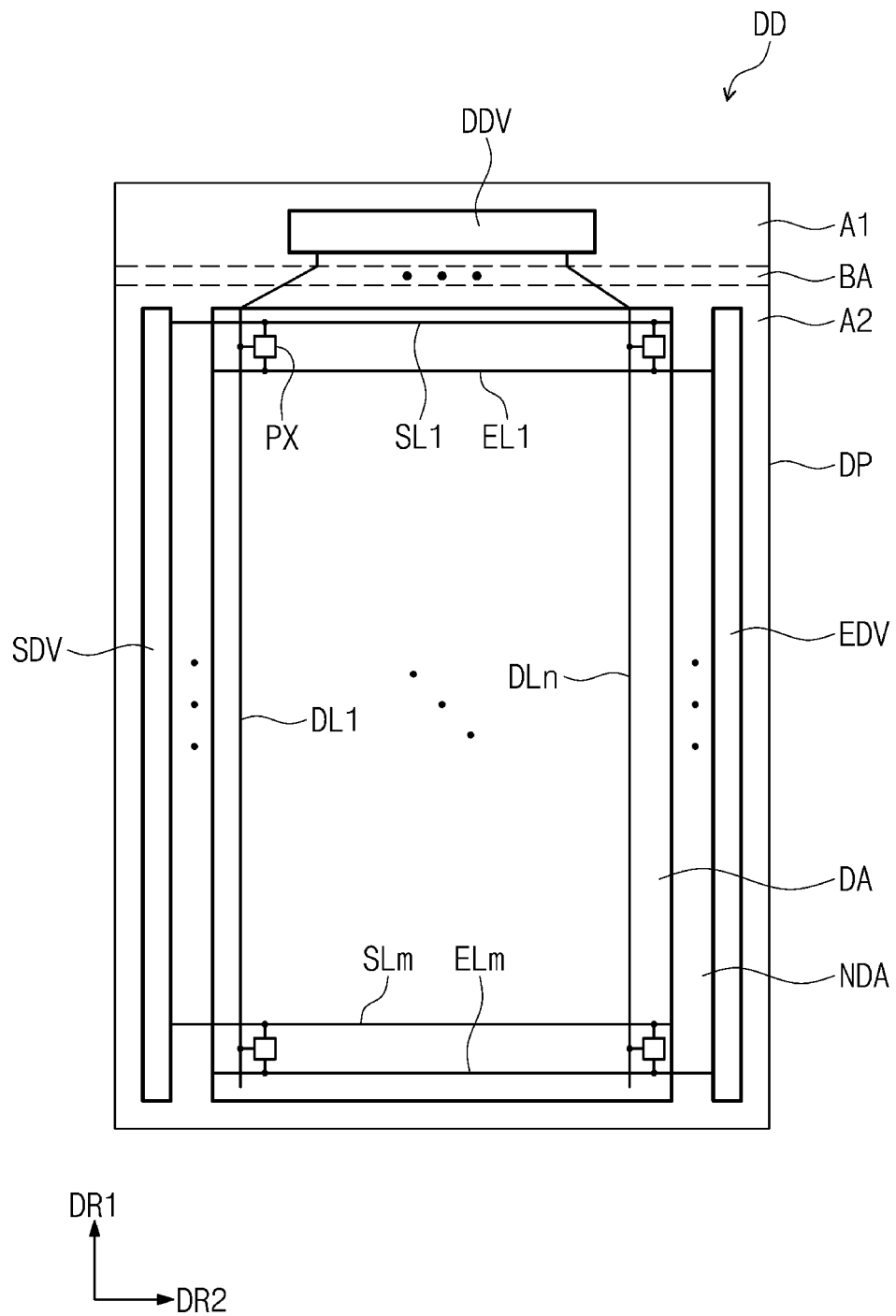
FIG. 5 is a diagram illustrating a planar structure of an embodiment of a display device, to which the panel protective film of FIG. 1 is attachable.

FIG. 5 is a diagram illustrating a planar structure of an embodiment of a display device, to which the panel protective film of FIG. 1 is attachable.

Referring to FIG. 5, a display device DD may include a display panel DP, a scan driver SDV, a data driver DDV, and an emission driver EDV.

The display panel DP may be a flexible display panel. In an embodiment, for example, the display panel DP may include a plurality of electronic devices disposed on a flexible substrate. The display panel DP may have an overall rectangular shape, for which relatively long sides are parallel to the first direction DR1 and for which relatively short sides are parallel to the second direction DR2.

The display panel DP which is disposed flat may have or define a flat surface defined by the first and second directions DR1 and DR2. The display panel DP may include a first region A1, a second region A2, and a bending region BA between the first region A1 and the second region A2 and at which the display panel DP is bendable. The first region A1, the second region A2, and the bending region BA may be arranged along the first direction DR1. The second region A2 may include a display region DA and a non-display region NDA which is adjacent to the display region DA, such as surrounding the display region DA without being limited thereto.

The display panel DP may include a pixel PX provided in plurality (e.g., a plurality of pixels PX or pixels PX), a plurality of scan lines SL1-SLm (e.g., scan lines SL1-SLm), a plurality of data lines DL1-DLn (e.g., date lines DL1-DLn), and a plurality of emission lines EL1-Elm (e.g., emission lines EL1-Elm), where m and n are natural numbers. The pixels PX may be arranged in a matrix shape, but the arrangement of the pixels PX may not be limited to this example and may be variously changed. The pixels PX may be disposed in the display region DA and may be connected to corresponding ones of the scan lines SL1-SLm, the data lines DL1-DLn, and the emission lines EL1-ELm.

The scan driver SDV, the data driver DDV, and the emission driver EDV may be disposed in the non-display region NDA. In an embodiment, for example, the scan driver SDV may be disposed in a portion of the non-display region NDA, which is located adjacent to a side of the display panel DP defined by one of the relatively long sides of the display panel DP.

The emission driver EDV may be disposed in another portion of the non-display region NDA adjacent to a side of the display panel DP defined by one of the relatively long sides of the display panel DP. Referring to FIG. 5, the emission driver EDV is disposed adjacent to a side of the display panel DP that is opposite to the side of the display panel DP at which the scan driver SDV is disposed. In an embodiment, the data driver DDV may be in the form of an integrated circuit chip and may be disposed in the first region A1.

The scan lines SL1-SLm may be lengthwise extended in the second direction DR2 and may be connected to the scan driver SDV. The data lines DL1-DLn may be lengthwise extended along the first direction DR1 and may be connected to the data driver DDV. The emission lines EL1-Elm may be lengthwise extended in the second direction DR2 and may be connected to the emission driver EDV.

The scan driver SDV may produce a plurality of scan signals, and the scan signals may be applied to the pixels PX through the scan lines SL1-SLm. The scan signals may be sequentially applied to the pixels PX. The data driver DDV may produce a plurality of data voltages, and the data voltages may be applied to the pixels PX through the data lines DL1-DLn. The emission driver EDV may produce a plurality of emission signals, and the emission signals may be applied to the pixels PX through the emission lines EL1-ELm.

Although not shown, the display device DD may include a timing controller (not shown) for controlling operations of the scan driver SDV, the data driver DDV, and the emission driver EDV.

The timing controller may generate scan control signals, data control signals, and emission control signals in response to control signals transmitted from outside the display device DD. The timing controller may receive image signals from outside the display device DD, may convert the image signals to a data format, which is suitable for interface specifications of the data driver DDV, and may provide the converted data to the data driver DDV.

The scan driver SDV may produce scan signals in response to the scan control signal, and the emission driver EDV may produce emission signals in response to the emission control signal. The data driver DDV may receive the image signals of the converted data format and then may generate data voltages corresponding to the image signals, in response to the data control signal.

The pixels PX may receive the data voltages in response to the scan signals. The pixels PX may emit light, which has a brightness level corresponding to the data voltage and constitutes an image, in response to the emission signals. A light-emitting time and/or image display time of the pixel PX may be controlled by the emission signals.

Figure 6:
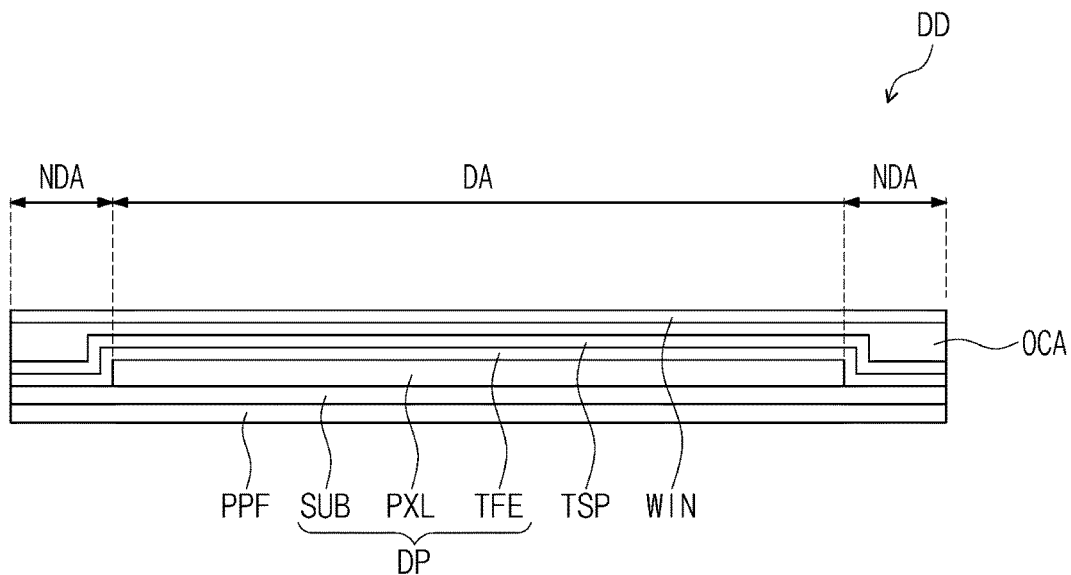
FIG. 6 is a cross-sectional view of the display device of FIG. 5.

FIG. 6 is a cross-sectional view of the display device of FIG. 5.

Referring to FIG. 6, the display device DD may include the display panel DP, a touch sensing member TSP disposed on the display panel DP, a window WIN disposed on the touch sensing member TSP, an adhesive agent OCA disposed between the touch sensing member TSP and the window WIN, and the panel protective film PPF disposed below the display panel DP. The panel protective film PPF may define an outer surface of the display device DD.

The panel protective film PPF may be the panel protective film PPF shown in FIG. 1. A method of attaching the panel protective film PPF to a bottom surface of the display panel DP will be described in more detail below. The panel protective film PPF may be otherwise defined as a protection substrate.

The display panel DP may be an organic light-emitting display panel. However, the invention is not limited to this example, and various image display panels, such as a liquid crystal display panel, an electrowetting display panel, and an electrophoretic display panel, may be used as the display panel DP.

The display panel DP may include a substrate SUB, a pixel layer PXL disposed on the substrate SUB, and a thin encapsulation layer TFE disposed on the substrate SUB to cover the pixel layer PXL. The substrate SUB may be a transparent substrate and may include a flexible plastic substrate. In an embodiment, for example, the substrate SUB may include polyimide ("PI").

The substrate SUB may include a display region DA and a non-display region NDA which is adjacent to the display region DA, similar those regions described above for the display device DD. The pixel layer PXL may be disposed in the display region DA. The pixel layer PXL may include a plurality of pixels PX, each of which includes a light-emitting element which generates and emits light for displaying an image.

The thin encapsulation layer TFE may include at least two inorganic layers and an organic layer which is disposed between the inorganic layers. The inorganic layers may include an inorganic material and may protect the pixel layer PXL from moisture or oxygen. The organic layer may include an organic material and may protect the pixel layer PXL from a contamination material such as dust particles.

The touch sensing member TSP may sense an external input (e.g., from an input device such as a user's hand, a touch pen, and so forth), may generate an input signal from the sensed external input, and may provide the input signal to the display panel DP. The touch sensing member TSP may include a plurality of touch sensor units (not shown) for sensing the external input. The touch sensor units may sense an external input in a capacitive manner. The display panel DP may receive the input signal from the touch sensing member TSP and may generate an image and/or perform a function corresponding to the input signal.

The window WIN may protect the display panel DP and the touch sensing member TSP from an external scratch and an external impact. The window WIN may be attached to the touch sensing member TSP by the adhesive agent OCA. The adhesive agent OCA may include an optical clear adhesive. An image produced by the display panel DP may be provided to outside the display device DD through the window WIN. The window WIN may define an outer surface of the display device DD.

The panel protective film PPF may protect a bottom portion of the display panel DP. Although not shown, a cushion layer may be further disposed below the panel protective film PPF. The cushion layer may absorb an external impact, which may be exerted on the lower portion of the display device DD, thereby protecting the display device DD. The cushion layer may include a foam sheet having an elastic property. The cushion layer may define an outer surface of the display device DD. The panel protective film PPF with or without the cushion layer may be considered a panel protective member, and may define an outer surface of the display device DD at the bottom portion of the display panel DP.

Figure 7:
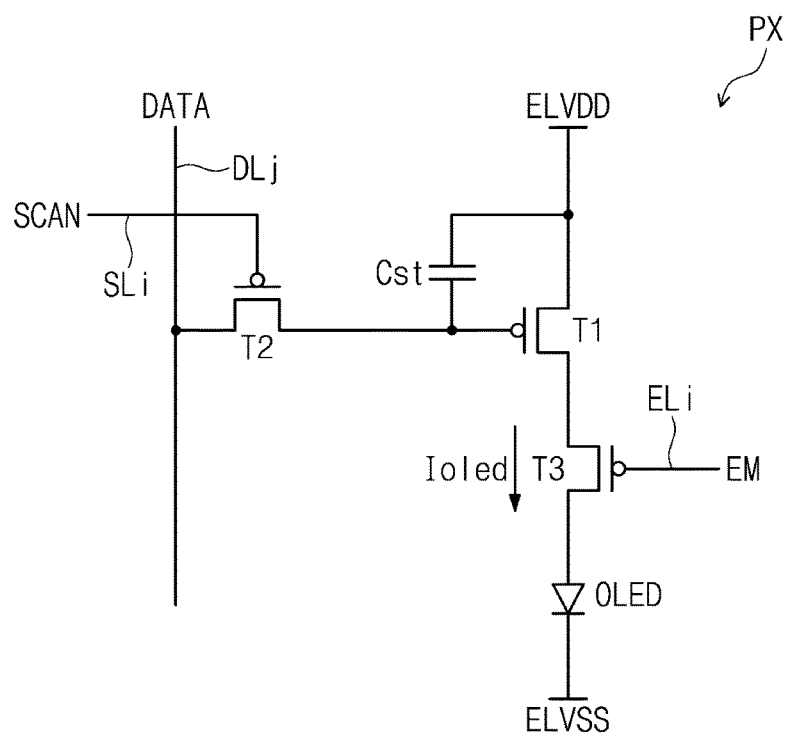
FIG. 7 is an equivalent circuit diagram of an embodiment of a pixel shown in FIG. 5.

FIG. 7 is an equivalent circuit diagram of an embodiment of a pixel shown in FIG. 5.

Although an example of an equivalent circuit diagram of one of the pixel PX is illustrated in FIG. 7, other ones of the pixels PX shown in FIG. 5 may have the same circuit structure as that of the pixel PX shown in FIG. 7.

Referring to FIG. 7, the pixel PX may be connected to a corresponding one (e.g., SLi) of the scan lines SL1-SLm, a corresponding one (e.g., DLj) of the data lines DL1-DLn, and a corresponding one (e.g., ELi) of the emission lines EL1-Elm, where i is a natural number less than or equal to m, and j is a natural number less than or equal to n.

The pixel PX may include a light-emitting element OLED, a driving transistor T1, a capacitor Cst, a switching transistor T2, and an emission control transistor T3. The light-emitting element OLED may be defined as an organic light-emitting diode.

A source terminal of the driving transistor T1 may be applied with a first voltage ELVDD, and a drain terminal of the driving transistor T1 may be connected to a source terminal of the emission control transistor T3. A gate terminal of the driving transistor T1 may be connected to a drain terminal of the switching transistor T2.

A gate terminal of the switching transistor T2 may be connected to the scan line SLi, and a source terminal of the switching transistor T2 may be connected to the data line DLj. A first electrode of the capacitor Cst may be connected to the source terminal of the driving transistor T1, and a second electrode of the capacitor Cst may be connected to the gate terminal of the driving transistor T1.

A gate terminal of the emission control transistor T3 may be connected to the emission line ELi, and a drain terminal of the emission control transistor T3 may be connected to an anode electrode of the light-emitting element OLED. A cathode electrode of the light-emitting element OLED may be applied with a second voltage ELVSS, which is lower than the first voltage ELVDD.

The switching transistor T2 may be turned on in response to a scan signal SCAN provided through the scan line SLi. If the switching transistor T2 is turned on, a data voltage DATA applied through the data line DLj may be provided to the gate terminal of the driving transistor T1.

The capacitor Cst may be charged to the data voltage DATA applied to the gate terminal of the driving transistor T1 and may be used to maintain the data voltage DATA, even after the switching transistor T2 is turned off.

The emission control transistor T3 may be turned on in response to an emission signal EM provided through the emission line ELi. In this case, the emission control transistor T3 may supply an electrical current Ioled from the driving transistor T1 to the light-emitting element OLED. The pixel PX may emit light during an applying period of the emission signal EM. An intensity of light emitted from the light-emitting element OLED may be dependent on an amount of the electrical current Ioled.

In an embodiment, the transistors T1-T3 of the pixel PX may be P-type metal-oxide-semiconductor ("PMOS") transistors, but the invention is not limited to this example. In an embodiment, for example, the transistors T1-T3 of the pixel PX may be N-type metal-oxide-semiconductor ("NMOS") transistors.

Figure 8:
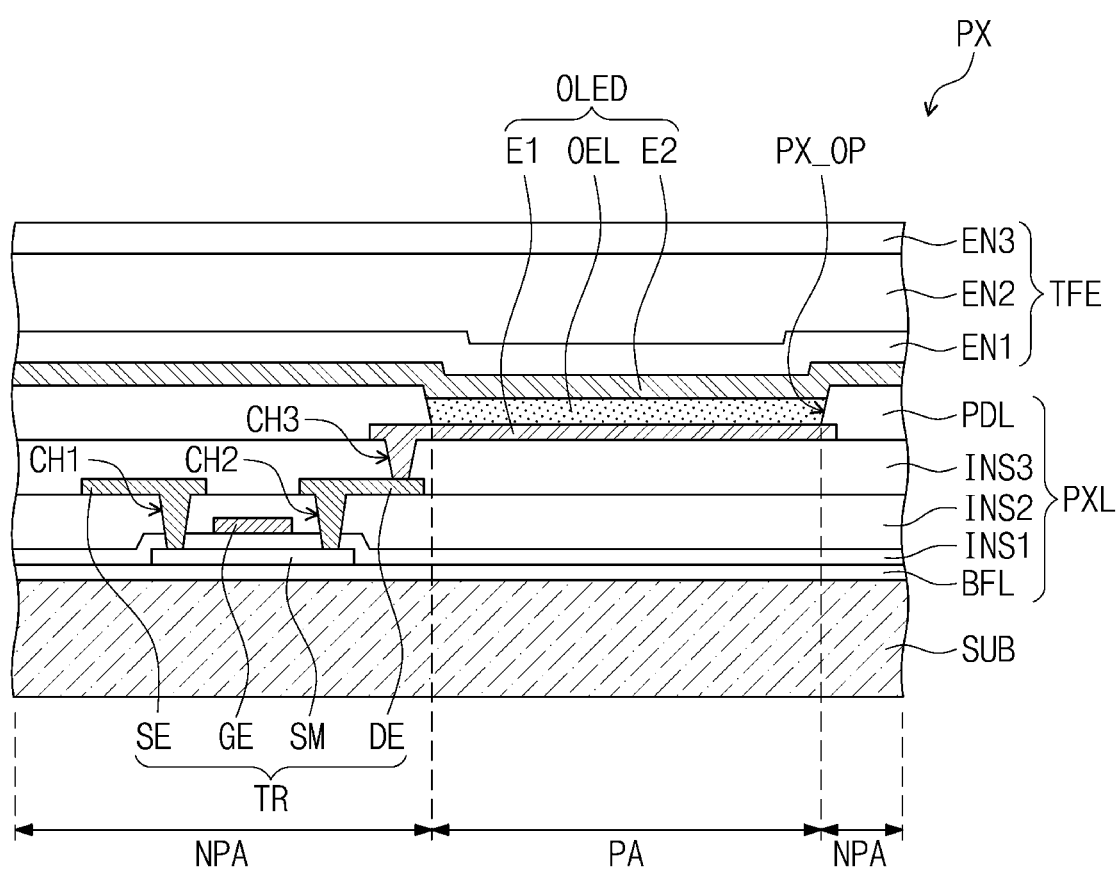
FIG. 8 is an enlarged cross-sectional view of an embodiment of the pixel of FIG. 7.

FIG. 8 is an enlarged cross-sectional view schematically of an embodiment of the pixel of FIG. 7.

Referring to FIG. 8, the pixel PX may include the light-emitting element OLED and a transistor TR which is connected to the light-emitting element OLED. The light-emitting element OLED may include a first electrode E1, a second electrode E2, and an organic light-emitting layer OEL disposed between the first electrode E1 and the second electrode E2.

The pixel PX may be divided into a pixel region PA and a non-pixel region NPA adjacent to the pixel region PA, such as being disposed around the pixel region PA. The light-emitting element OLED may be disposed in the pixel region PA, and the transistor TR may be disposed in the non-pixel region NPA.

The transistor TR may be the emission control transistor T3. The transistor TR and the light-emitting element OLED may be disposed on the substrate SUB. A buffer layer BFL may be disposed on the substrate SUB, and the buffer layer BFL may include an inorganic material.

A semiconductor layer SM of the transistor TR may be disposed on the buffer layer BFL. The semiconductor layer SM may be formed of or include an inorganic semiconductor material (e.g., amorphous silicon or poly silicon) or an organic semiconductor material. In addition, the semiconductor layer SM may include a semiconductor oxide. Although not shown in FIG. 8, the semiconductor layer SM may include a source region, a drain region, and a channel region between the source region and the drain region.

A first insulating layer INS1 may be disposed on the buffer layer BFL to cover the semiconductor layer SM. The first insulating layer INS1 may include an inorganic material. A gate electrode GE of the transistor TR may be disposed on the first insulating layer INS1 to be overlapped with the semiconductor layer SM. The gate electrode GE may be disposed to be overlapped with the channel region of the semiconductor layer SM.

A second insulating layer INS2 may be disposed on the first insulating layer INS1 to cover the gate electrode GE. The second insulating layer INS2 may be defined as an interlayer insulating layer. The second insulating layer INS2 may include an organic material and/or an inorganic material.

A source electrode SE and a drain electrode DE of the transistor TR may be disposed on the second insulating layer INS2 to be spaced apart from each other. The source electrode SE may be connected to the source region of the semiconductor layer SM at or through a first contact hole CH1, which is defined to penetrate the first insulating layer INS1 and the second insulating layer INS2. The drain electrode DE may be connected to the drain region of the semiconductor layer SM at or through a second contact hole CH2, which is defined to penetrate the first insulating layer INS1 and the second insulating layer INS2.

A third insulating layer INS3 may be disposed on the second insulating layer INS2 to cover the source electrode SE and the drain electrode DE of the transistor TR. The third insulating layer INS3 may be defined as a planarization layer providing a flat top surface and may include an organic material.

The first electrode E1 may be disposed on the third insulating layer INS3. The first electrode E1 may be connected to the drain electrode DE of the transistor TR at or through a third contact hole CH3, which is defined to penetrate the third insulating layer INS3. The first electrode E1 may be defined as a pixel electrode or an anode electrode. The first electrode E1 may include a transparent electrode or a reflective electrode.

A pixel definition layer PDL may be disposed on the first electrode E1 and the third insulating layer INS3 to expose a portion of the first electrode E1. An opening PX_OP, which exposes the portion of the first electrode E1, may be defined in the pixel definition layer PDL.

The organic light-emitting layer OEL may be disposed in the opening PX_OP and on the first electrode E1. The organic light-emitting layer OEL may generate one of red, green, and blue lights. However, the invention is not limited to this example, and the organic light-emitting layer OEL may include combination of organic materials capable of generating red, green, and blue lights and/or may generate a white light.

The second electrode E2 may be disposed on the pixel definition layer PDL and the organic light-emitting layer OEL. The second electrode E2 may be defined as a common electrode or a cathode electrode. The second electrode E2 may include a transparent electrode or a reflective electrode.

Where the display panel DP is a top emission type organic light-emitting display panel, the first electrode E1 may be formed of or include a reflective electrode and the second electrode E2 may be formed of or include a transparent electrode. Where the display panel DP is a bottom emission type organic light-emitting display panel, the first electrode E1 may be formed of or include a transparent electrode and the second electrode E2 may be formed of or include a reflective electrode.

The thin encapsulation layer TFE may be disposed on the light-emitting element OLED to cover the pixel PX. The thin encapsulation layer TFE may include a first encapsulation layer EN1 disposed on the light-emitting element OLED, a second encapsulation layer EN2 disposed on the first encapsulation layer EN1, and a third encapsulation layer EN3 disposed on the second encapsulation layer EN2.

Each of the first and third encapsulation layers EN1 and EN3 may include an inorganic material, and the second encapsulation layer EN2 may include an organic material. A thickness of the second encapsulation layer EN2 may be larger than a thickness of each of the first and third encapsulation layers EN1 and EN3. A layer between the substrate SUB and the thin encapsulation layer TFE may be defined as the pixel layer PXL.

The first voltage ELVDD may be applied to the first electrode E1, and the second voltage ELVSS may be applied to the second electrode E2. In the case where holes and electrons are injected into the organic light-emitting layer OEL, excitons may be produced, and light may be emitted from the light-emitting element OLED, when the excitons are transitioned to a ground state. The light-emitting element OLED may emit red, green, or blue light, which constitutes an image to be viewable from outside the display device DD, by using an electrical current flowing therethrough.

FIGS. 9 to 15 are diagrams illustrating structures provided by an embodiment of a method of manufacturing a display device using the protective film of FIG. 1, according to the invention.

Figure 9:
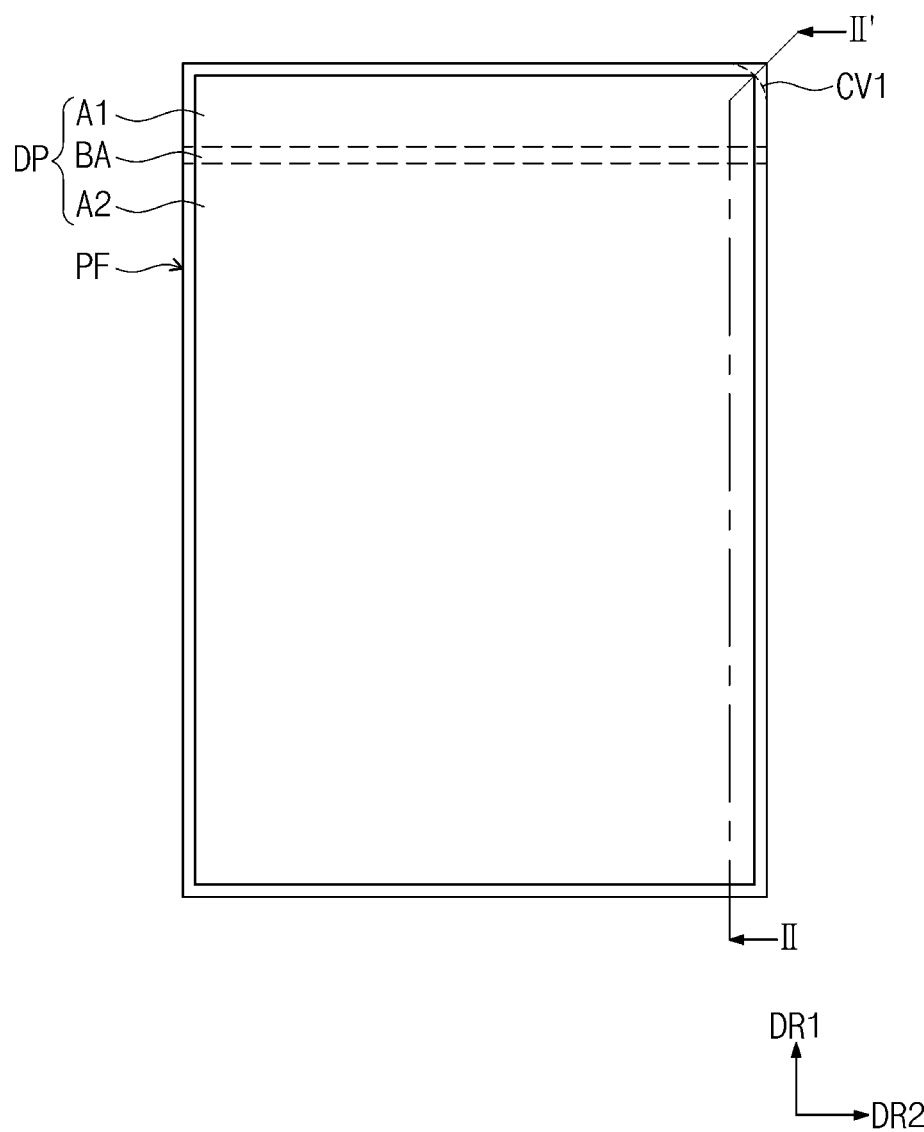
FIGS. 9 to 15 are diagrams illustrating structures provided by an embodiment of a method of manufacturing a display device using the protective film of FIG. 1, according to the invention.

For convenience in illustration, only the first region A1, the second region A2, and the bending region BA of the display panel DP are illustrated in FIG. 9, and other elements of the display panel DP are omitted. Furthermore, in FIGS. 10, 11, 13, 14, and 15, a detail cross-sectional structure of the display panel DP is not illustrated for convenience of illustration.

Figure 10:
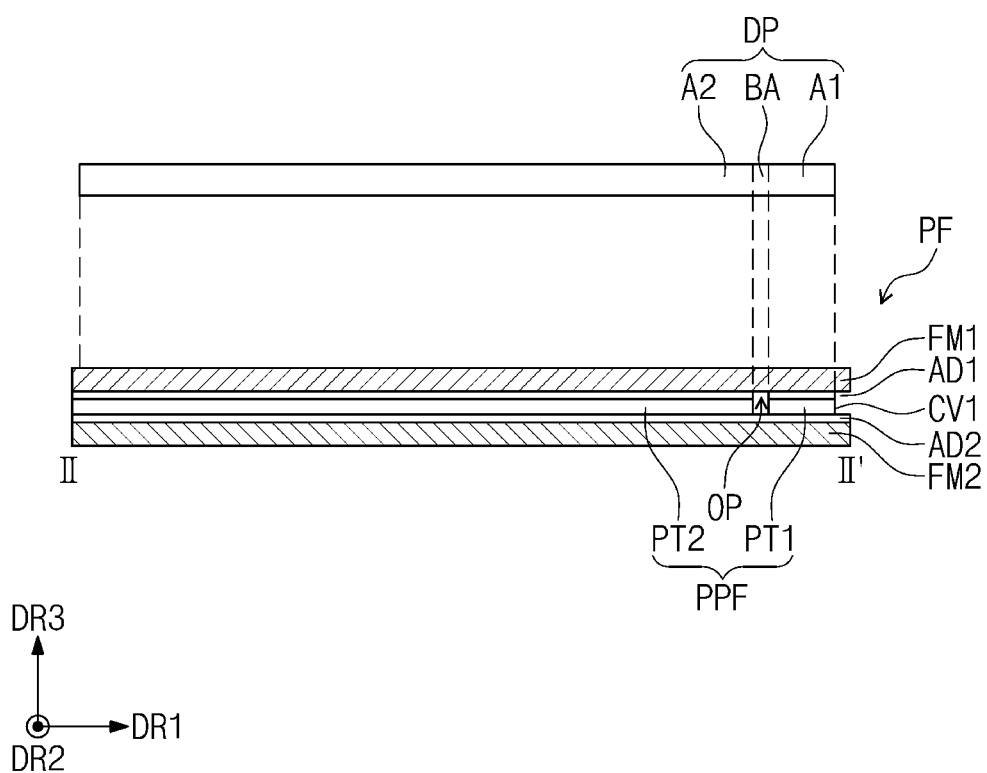

FIG. 9 is a top plan view illustrating a display panel DP and a protective film PF which is disposed below the display panel DP. FIG. 10 is a cross-sectional view taken along line II-II' of FIG. 9.

Substantially, FIG. 10 may correspond to the cross-sectional view of FIG. 3. In FIG. 9, the first curvilinear portion CV1 is depicted with a dotted line since the panel protective film PPF is disposed below the display panel DP.

Referring to FIGS. 9 and 10, the protective film PF may be disposed below the display panel DP, along the third direction DR3.

The protective film PF may have a total planar area larger than that of the display panel DP. The first portion PT1 of the panel protective film PPF may be overlapped with the first region A1 of the display panel DP. The second portion PT2 of the panel protective film PPF may be overlapped with the second region A2 of the display panel DP. The opening OP of the panel protective film PPF may be overlapped with the bending region BA of the display panel DP. The display panel DP is provided separately from the protective film PF, and boundaries of overlapping portions between these elements are shows with dotted lines in FIGS. 9 to 15.

Figure 11:
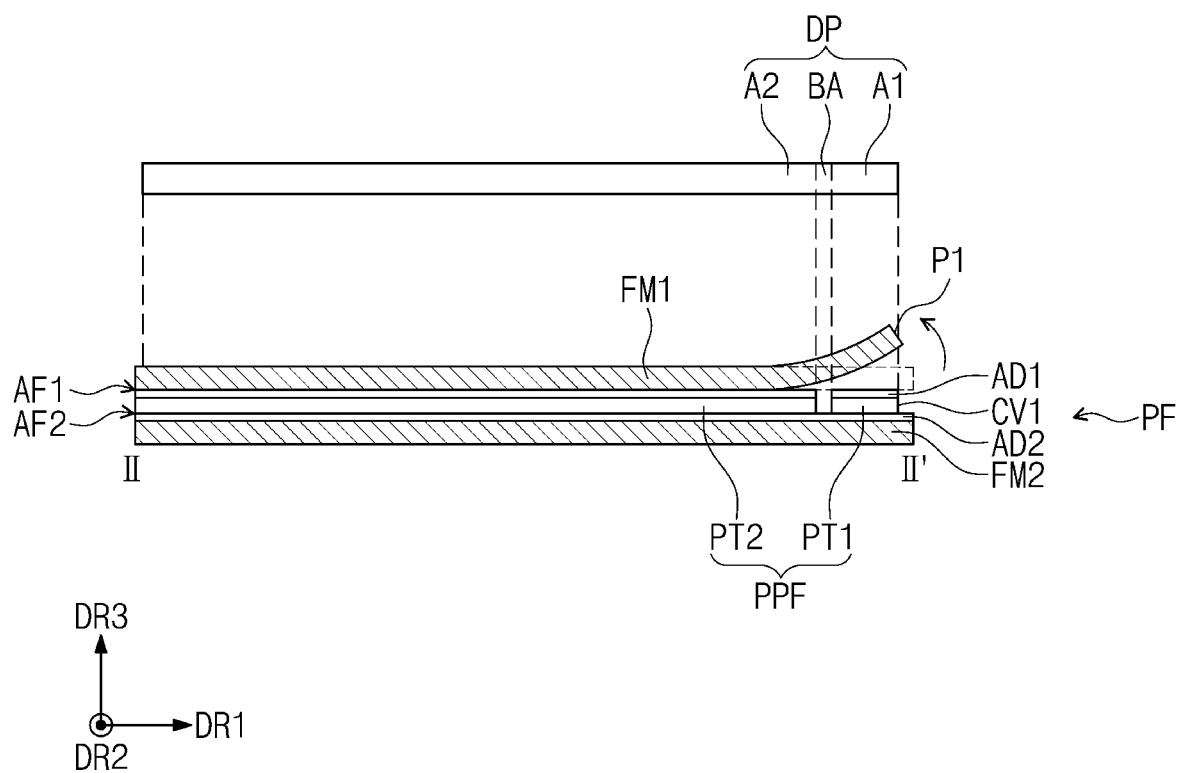
Figure 12A:
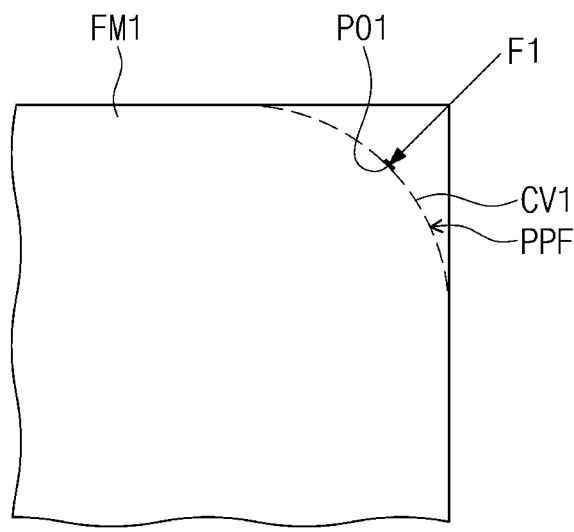
Figure 12B:
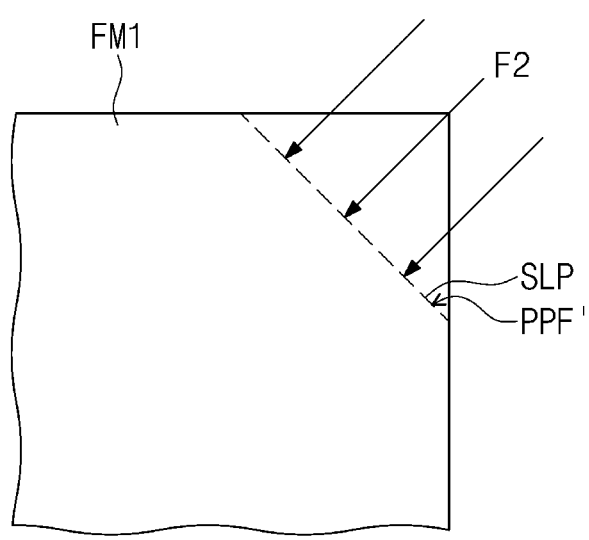

FIG. 11 is a diagram illustrating a process of removing the first film FM1 of FIG. 10. FIG. 12A is a diagram illustrating a delamination force relative to a panel protective film PPF having a first curved edge at the first curvilinear portion CV1, which is produced when the first film FM1 of FIG. 11 is delaminated from the panel protective film PPF having the curved edge. FIG. 12B is a diagram illustrating a delamination force relative to a panel protective film PPF' having a linearly inclined edge, which is produced when the first film FM1 is delaminated from the panel protective film PPF' having the inclined surface.

For convenience in illustration, FIG. 11 illustrates a cross-sectional structure corresponding to FIG. 10.

Referring to FIG. 11, the protective film PF may be disposed below the display panel DP, and then, the first film FM1 may be removed from the protective film PF. That is, the first film FM1 is detachably disposed on the panel protective film PPF. The first film FM1 may be delaminated from the first adhesive agent AD1. Since the delamination of the first film FM1 is started from a portion P1 of the first film FM1 that has an outwardly protruding shape relative to the first curvilinear portion CV1 of the panel protective film PPF, the first film FM1 may be easily separated from or delaminated from the first adhesive agent AD1.

Since the second adhesion force at the second interface AF2 is greater than the first adhesion force at the first interface AF1, the second film FM2 may not be delaminated from the panel protective film PPF, when the first film FM1 is delaminated from the first adhesive agent AD1. Thus, the second film FM2 may remain attached to the panel protective film PPF, even after the delamination of the first film FM1 from the first adhesive agent AD1. The delaminating of the first film FM1 from the first adhesive agent AD1 exposes an upper surface of the first adhesive agent AD1. A bottom portion (or surface) of the display panel DP may face the protective film PF (FIG. 11), and may be attachable to the first adhesive agent AD1 at the exposed upper surface thereof.

Where the first adhesion force at the first interface AF1 is greater than the second adhesion force at the second interface AF2, the panel protective film PPF may be lifted from the second film FM2 along with the first film FM1, when the first film FM1 is delaminated. Thus, the panel protective film PPF may be delaminated from the second film FM2. In an embodiment, for example, the second adhesive agent AD2 may be detached from the panel protective film PPF. By contrast, according to one or more embodiment of the invention, the first adhesion force at the first interface AF1 may be weaker than the second adhesion force at the second interface AF2, the second adhesive agent AD2 may not be prematurely detached from the panel protective film PPF.

Referring to FIG. 12A, when the first film FM1 is delaminated from the panel protective film PPF, the delamination may be started from a first point PO1 along the first curvilinear portion CV1 (single arrow shown in FIG. 12A). However, in the case where the first curvilinear portion CV1 is not defined and a portion corresponding to the first curvilinear portion CV1 is formed as a linearly inclined surface SLP, as shown in a panel protective film PPF' of FIG. 12B, delamination may be started along an entire portion of the inclined surface SLP (three diagonal arrows shown in FIG. 12B), when the first film FM1 is delaminated from the panel protective film PPF'.

An initial delamination force, which is produced when the first film FM1 is delaminated from the panel protective film PPF, may be defined as a first delamination force F1. An initial delamination force, which is produced when the first film FM1 is delaminated from the panel protective film PPF', may be defined as a second delamination force F2. The initial delamination force may be proportional to a contact area between the films when the delamination process is started. Thus, the first delamination force F1 may be weaker than the second delamination force F2.

The stronger the initial delamination force, the more difficult the delamination process becomes in separating two layers from each other. In an embodiment, since the first curvilinear portion CV1 is provided at an inner area of the protective film PF, the first delamination force F1 may be exerted on the first film FM1 at the initial stage of the delamination process. Since the initial delamination force is reduced by employing the curvilinear portion CV1, performing perform the delamination process of the first film FM1 may be simplified.

Figure 13:
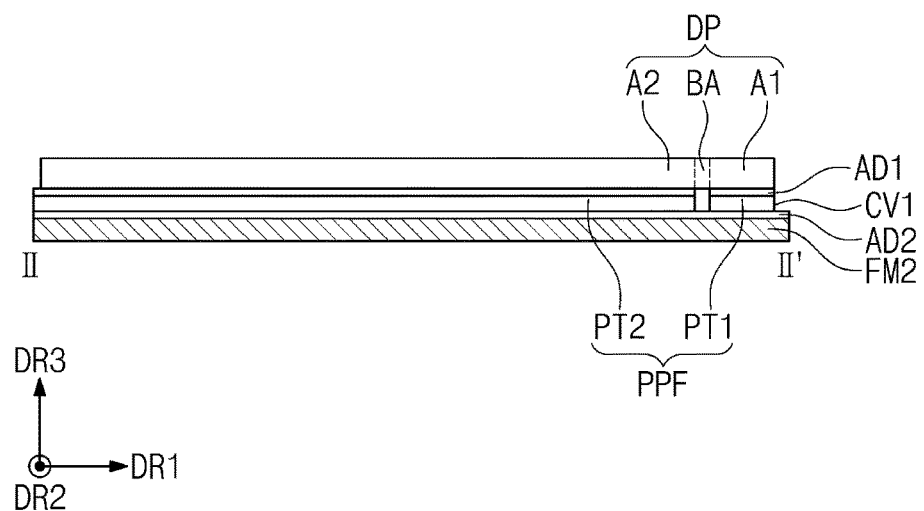
Figure 14:
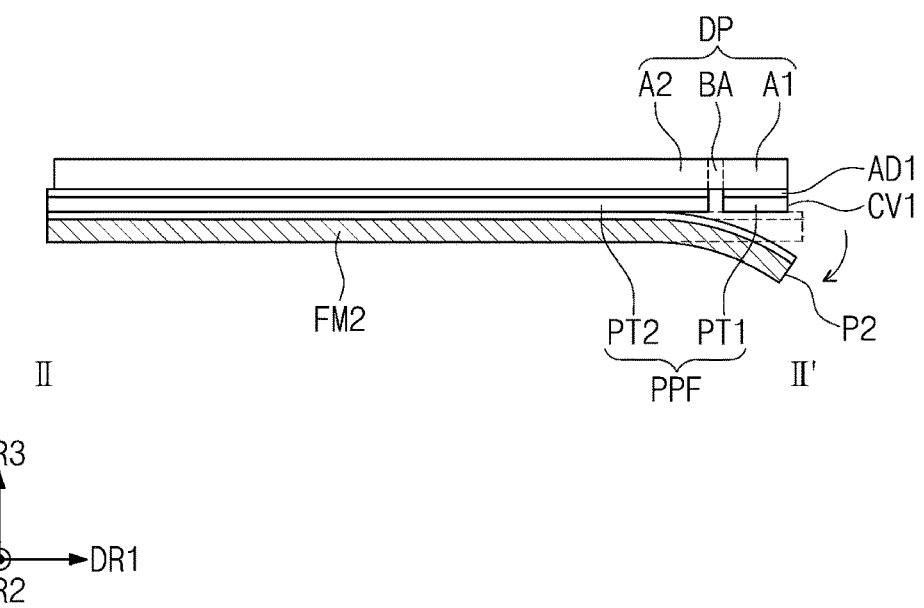
Figure 15:
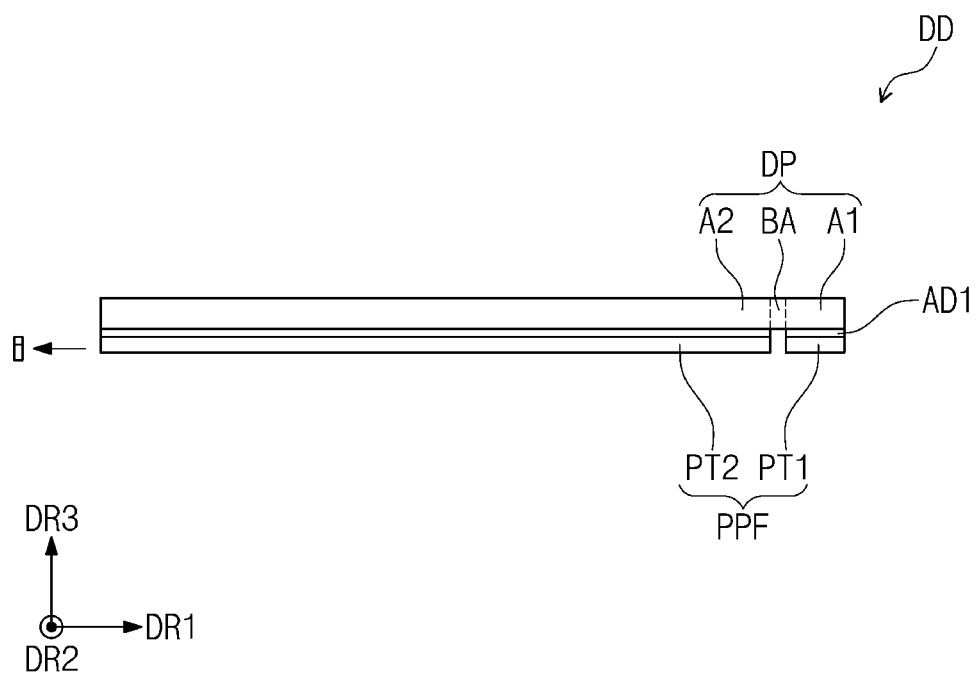

FIG. 13 is a diagram illustrating the panel protective film PPF, which is attached to the bottom portion of the display panel DP by the first adhesive agent AD1. FIG. 14 is a diagram illustrating a method of removing the second film FM1 on the panel protective film PPF of FIG. 13. FIG. 15 is a diagram illustrating the display device DD which is completed by including the panel protective film PPF attached to the display panel DP, after the removing of the second film FM2 from the panel protective film PPF of FIG. 14.

For convenience in description, cross-sectional views corresponding to FIG. 10 are illustrated in FIGS. 13, 14, and 15.

Referring to FIG. 13, the first film FM1 may be removed from the first adhesive agent AD1 to expose the upper surface thereof, and the first adhesive agent AD1 may remain on and attached to the panel protective film PPF. The panel protective film PPF may be attached to the bottom portion of the display panel DP by the first adhesive agent AD1. The panel protective film PPF includes a first surface and a second surface which is opposite to the first surface, where the panel protective film PPF attached to the display panel DP disposes the first surface of the panel protective film PPF closer to the display panel DP than the second surface. Owing to an edge of the panel protective film PPF at the first curvilinear portion CV1 thereof being spaced apart from an edge of the second film FM2 and the second adhesive agent AD2, portions of the second film FM2 and the second adhesive agent AD2 extend further in the first direction DR1 from the curvilinear portion CV1.

Referring to FIG. 14, the second film FM2 may be removed from the display panel DP. The second film FM2 and the second adhesive agent AD2 may together be delaminated from the panel protective film PPF. That is, the second film FM2 is detachably disposed on the panel protective film PPF. Since the delamination of the second film FM2 and the second adhesive agent AD2 is started from a portion P2 of the second film FM2 that is disposed outside of the first curvilinear portion CV1, the second film FM2 may be easily delaminated from the panel protective film PPF. Since the second adhesive agent AD2 is more strongly adhered to the second film FM2 than to the panel protective film PPF, the second adhesive agent AD2 may be easily delaminated from the panel protective film PPF when a delamination force is applied to the second film FM2 starting from the portion P2.

Referring to the structures of the panel protective films PPF and PPF' described with reference to FIGS. 12A and 12B, the first delamination force F1 may be produced when the second film FM2 is delaminated from the first curvilinear portion CV1 of the panel protective film PPF, and the second delamination force F2 may be produced when the second film FM2 is delaminated from the inclined surface SLP of the panel protective film PPF'.

Since, as described above, the initial delamination force is proportional to the contact area during the initial delamination process, the first delamination force F1 may be weaker than the second delamination force F2. Thus, in one or more embodiments of the invention, the initial delamination force may be relatively weak (e.g., the first delamination force F1 relating to the first curvilinear portion CV1) when the second film FM2 is initially delaminated. Thus, the delamination process of the second film FM2 may be more easily performed.

As a result, the delamination of the first and second films FM1 and FM2 may be more easily started from the portions P1 and P2 of the first and second films FM1 and FM2 disposed outside the first curvilinear portion CV1, respectively.

Referring to FIG. 15, as a result of the removal of the second film FM2 together with the second adhesive agent AD2 from the panel protective film PPF, the display device DD is provided including the panel protective film PPF remaining attached to the bottom portion of the display panel DP.

As described above, the planar area of the panel protective film PPF may be larger than that of the display panel DP. Referring to FIG. 14, for example, the panel protective film PPF and the first adhesive agent AD1 extend further than the display panel DP along a direction opposite to the first direction DR1. In an embodiment, portions of the panel protective film PPF extended further from outer edges of the display panel DP owing to the larger planar area of the panel protective film PPF, may be removed. Referring to FIG. 15, for example, portions of the panel protective film PPF and the first adhesive agent AD1 which had extended further than the left edge of the display panel DP, are shown separated from a remainder of the stacked structure by an arrow.

FIG. 15 illustrates the display device DD being disposed flat, e.g., along a single plane defined by the first direction DR1 and the second direction DR2. The panel protective film PPF attached to the bottom portion of the display panel DP may define an outer surface of the display device DD.

Although not shown, the display device DD may be bent at bending region BA to dispose the first region A1 is disposed under the second region A2 along a direction opposite to the third direction DR3. Since the panel protective film PPF and the first adhesive agent AD1 are not disposed at a region corresponding to the bending region BA (e.g., opening OP in panel protective film PPF), a total thickness of the display device DD may be reduced at the bending region BA. Thus, the bending of the display device DD at the bending region BA may be more easily performed.

FIGS. 16 to 23 are diagrams illustrating structures provided by an embodiment of a method of manufacturing a protective film, according to the invention.

Figure 16:
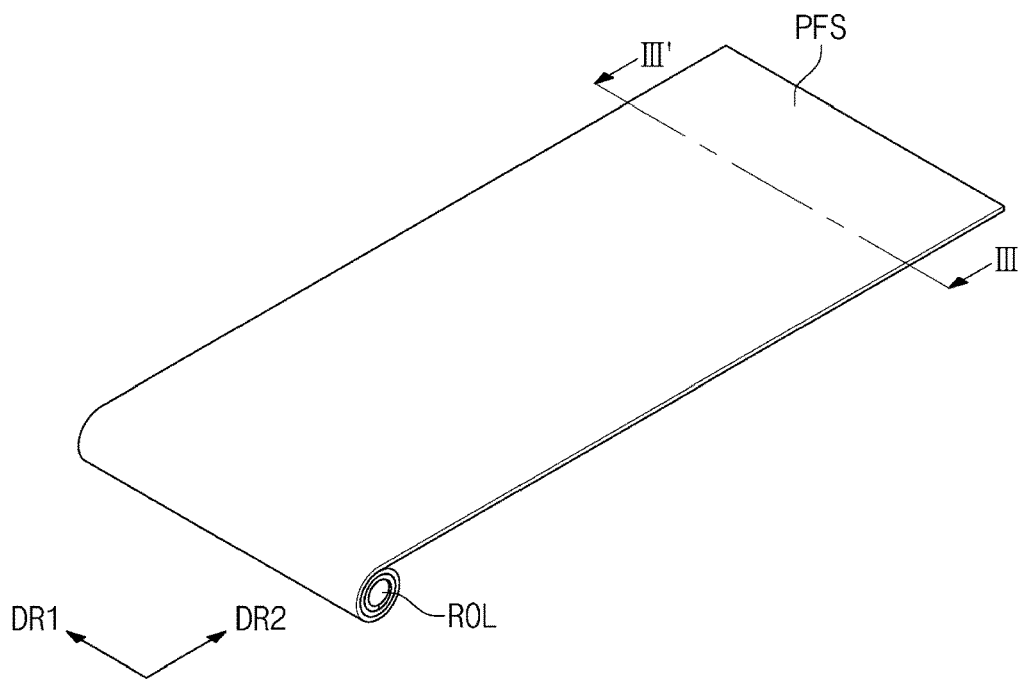
FIGS. 16 to 23 are diagrams illustrating structures provided by an embodiment of a method of manufacturing a protective film, according to the invention.

FIG. 16 is a diagram illustrating an example of a protective film sheet PFS, which is used to manufacture a protective film PF.

Referring to FIG. 16, a protective film sheet PFS rolled around a roller ROL may be prepared. The roller ROL may have a cylindrical shape elongated along the first direction DR1. The protective film sheet PFS may be unrolled in the second direction DR2, when the protective film PF is manufactured.

Figure 17:
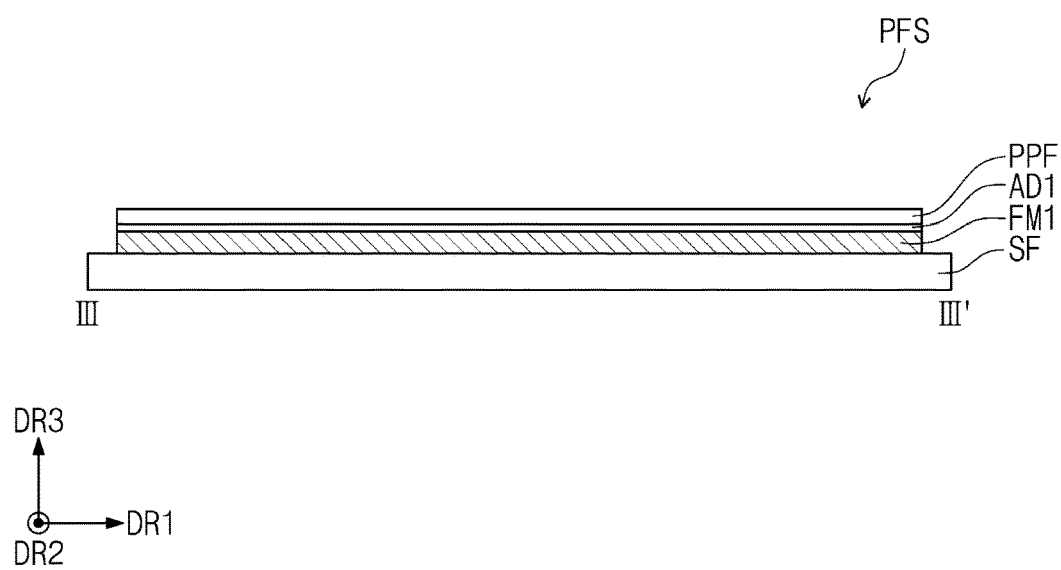

FIG. 17 is a cross-sectional view taken along line III-III' of FIG. 16.

Referring to FIG. 17, the protective film sheet PFS may include sheet forms of each of the first film FM1, the panel protective film PPF disposed on the first film FM1, a support film SF disposed below the first film FM1, and the first adhesive agent AD1 disposed between the panel protective film PPF and the first film FM1. Portions of these sheet forms may become respective layers which are included in a protective film PF manufactured from the protective film sheet PFS and a display device DD which includes the manufactured form of the protective film PF, as described above.

The first film FM1, the panel protective film PPF, and the first adhesive agent AD1 may be represented by the same elements as the first film FM1, the panel protective film PPF, and the first adhesive agent AD1 shown in FIG. 3. A planar area of the support film SF may be greater than that of the first film FM1 and the panel protective film PPF.

Figure 18:
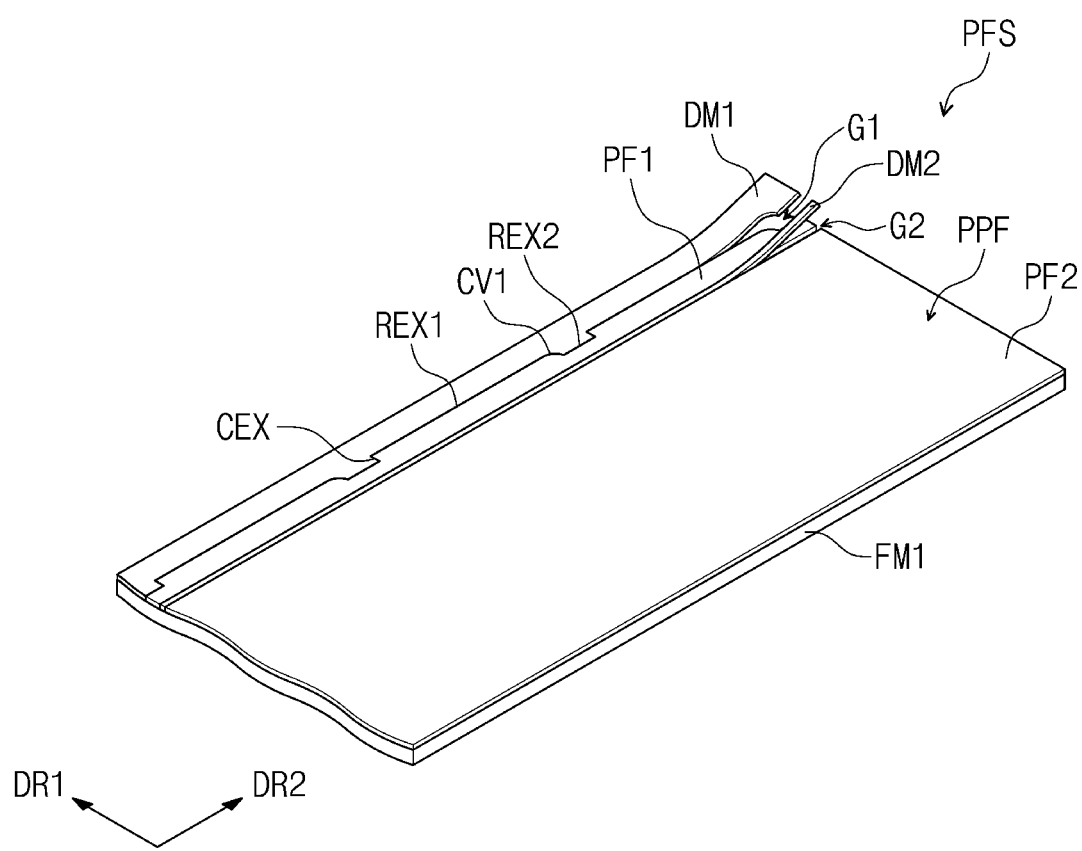

FIG. 18 is a diagram illustrating a planar structure of the first film FM1 and the panel protective film PPF. For convenience in illustration, the support film SF and the first adhesive agent AD1 are omitted from FIG. 18.

Referring to FIG. 18, the panel protective film PPF may include or define portions thereof as a first dummy portion DM1, a second dummy portion DM2, a first protective film PF1 disposed between the first dummy portion DM1 and the second dummy portion DM2, and a second protective film PF2 spaced apart from the first protective film PF1 with the second dummy portion DM2 interposed therebetween.

The first dummy portion DM1 and the second dummy portion DM2 may be spaced apart from each other along the first direction DR1 and may be lengthwise extended in the second direction DR2.

The first dummy portion DM1 and the second dummy portion DM2 of the panel protective film PPF may be removed. In substance, the first protective film PF1 and the second protective film PF2 may be formed by removing the first dummy portion DM1 and the second dummy portion DM2. The first protective film PF1 and the second protective film PF2 may be remaining portions of the protective film sheet PFS after removal of the first dummy portion DM1 and the second dummy portion DM2.

The removing of the first dummy portion DM1 may define a first groove G1 in the remaining portions of protective film sheet PFS. The removing of the second dummy portion DM2 may define a second groove G2 in the protective film sheet PFS. A first edge of the first protective film PF1 adjacent to the first groove G1 and disposed furthest along the first direction DR1 may include or be defined by a first horizontal extension REX1, the first curvilinear portion CV1, a second horizontal extension REX2, and a vertical extension CEX. One or more of these features may collectively define the first edge of the first protective film PF1.

In FIG. 18, the first edge of the first protective film PF1 disposes repeating, in order, the first horizontal extension REX1, the first curvilinear portion CV1, the second horizontal extension REX2 and the vertical extension CEX, along the second direction DR2.

The first horizontal extension REX1 may be lengthwise extended in the second direction DR2. The first curvilinear portion CV1 may be extended from a first end of the first horizontal extension REX1 toward a second edge of the first protective film PF1 which is opposite to the first edge thereof. Substantially, the first curvilinear portion CV1 may be the first curvilinear portion CV1 of a panel protective film PPF shown in FIG. 2.

The first and second edges of the first protective film PF1 may be opposite to each other along the first direction DR1, and the second edge of the first protective film PF1 may be closest to and face the second protective film PF2. The second edge of the first protective film PF1 may be lengthwise extended along the second direction DR2.

The second horizontal extension REX2 may be extended from an end of the first curvilinear portion CV1 in the second direction DR2. The vertical extension CEX may be extended from a second end of the first horizontal extension REX1 opposite to the first end thereof along the first direction DR1.

Figure 19:
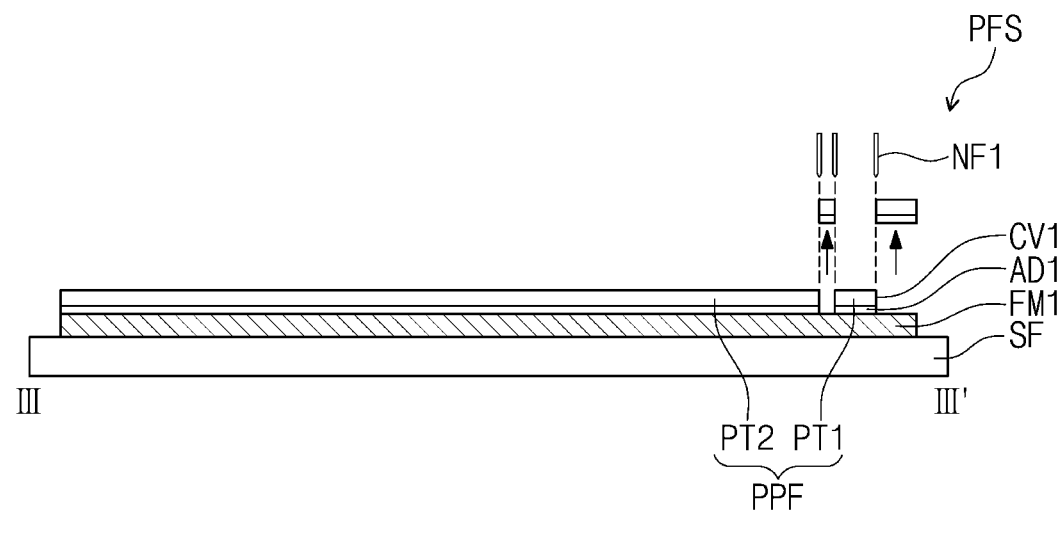
Figure 19:
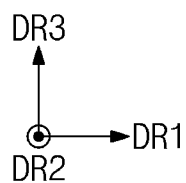
Figure 20:
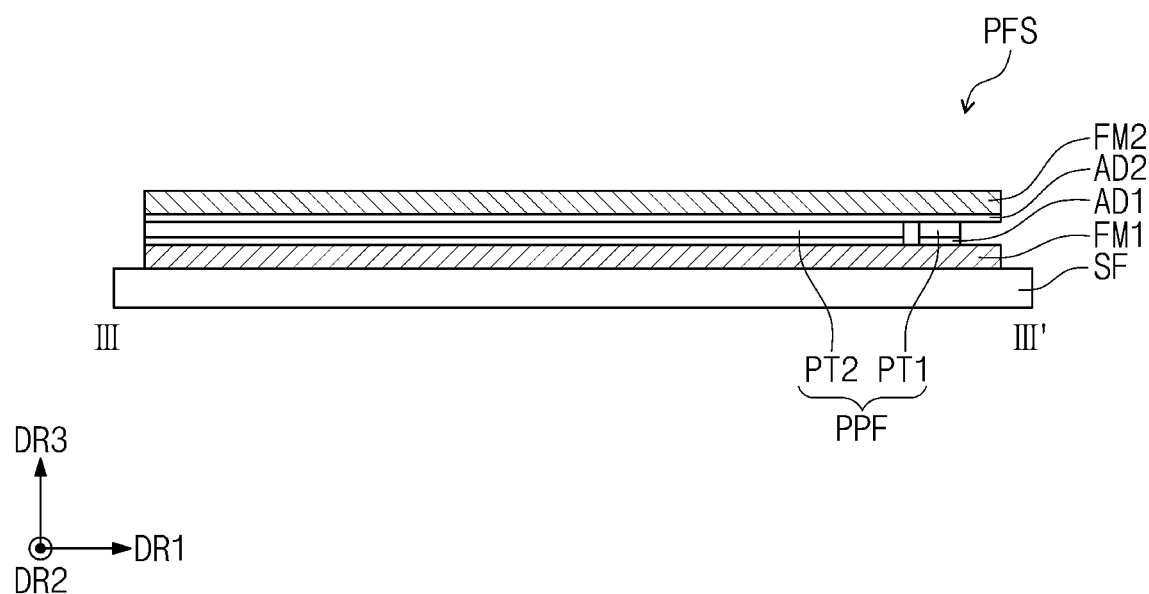

FIG. 19 is a diagram illustrating a method of removing the first and second dummy portions DM1 and DM2. FIG. 20 is a diagram illustrating the second film FM2, which is disposed on the panel protective film PPF.

For convenience in illustration, each of FIGS. 19 and 20 is illustrated as a cross-sectional view corresponding to FIG. 17.

Referring to FIG. 19, portions of the first adhesive agent AD1 overlapped with the first and second dummy portions DM1 and DM2 may also be removed together therewith, when the first dummy portion DM1 and the second dummy portion DM2 are removed from the protective film sheet PFS. The first and second dummy portions DM1 and DM2 and the portions of the first adhesive agent AD1 which are overlapped with the first and second dummy portions DM1 and DM2 may be cut in a pressurized manner by a cutting tool such as a knife NH. The first and second dummy portions DM1 and DM2 and the portions of the first adhesive agent AD1 overlapped with the first and second dummy portions DM1 and DM2 which are cut, may be delaminated and removed from remaining portions of the panel protective film PPF and the first adhesive agent AD1. The removing of the first and second dummy portions DM1 and DM2 together with the first adhesive agent AD1 from remaining portions of the panel protective film PPF and the first adhesive agent AD1, exposes an upper surface of the first film FM1 outside the remaining portions of the panel protective film PPF and the first adhesive agent AD1.

Referring to FIG. 20, with the first and second dummy portions DM1 and DM2 removed together with the first adhesive agent AD1, the second film FM2 may be provided on an exposed surface of the panel protective film PPF which is opposite to a surface thereof facing the first film FM1. The second film FM2 may be commonly provided on and overlapping the first and second protective films PF1 and PF2 and the first and second grooves G1 and G2. The second film FM2 may cover the first and second grooves G1 and G2, by disposing edges of the second film FM2 further than edges of the first protective film PF1 at the first groove G1.

The second adhesive agent AD2 may be provided between the second film FM2 and the panel protective film PPF. The second adhesive agent AD2 and the second film FM2 may be in sheet forms, and portions of these sheet forms may become respective layers which are included in the manufactured form of the protective film PF, as described above. The second film FM2 and the second adhesive agent AD2 may be the same elements as the second film FM2 and the second adhesive agent AD2 shown in FIG. 3.

Figure 21:
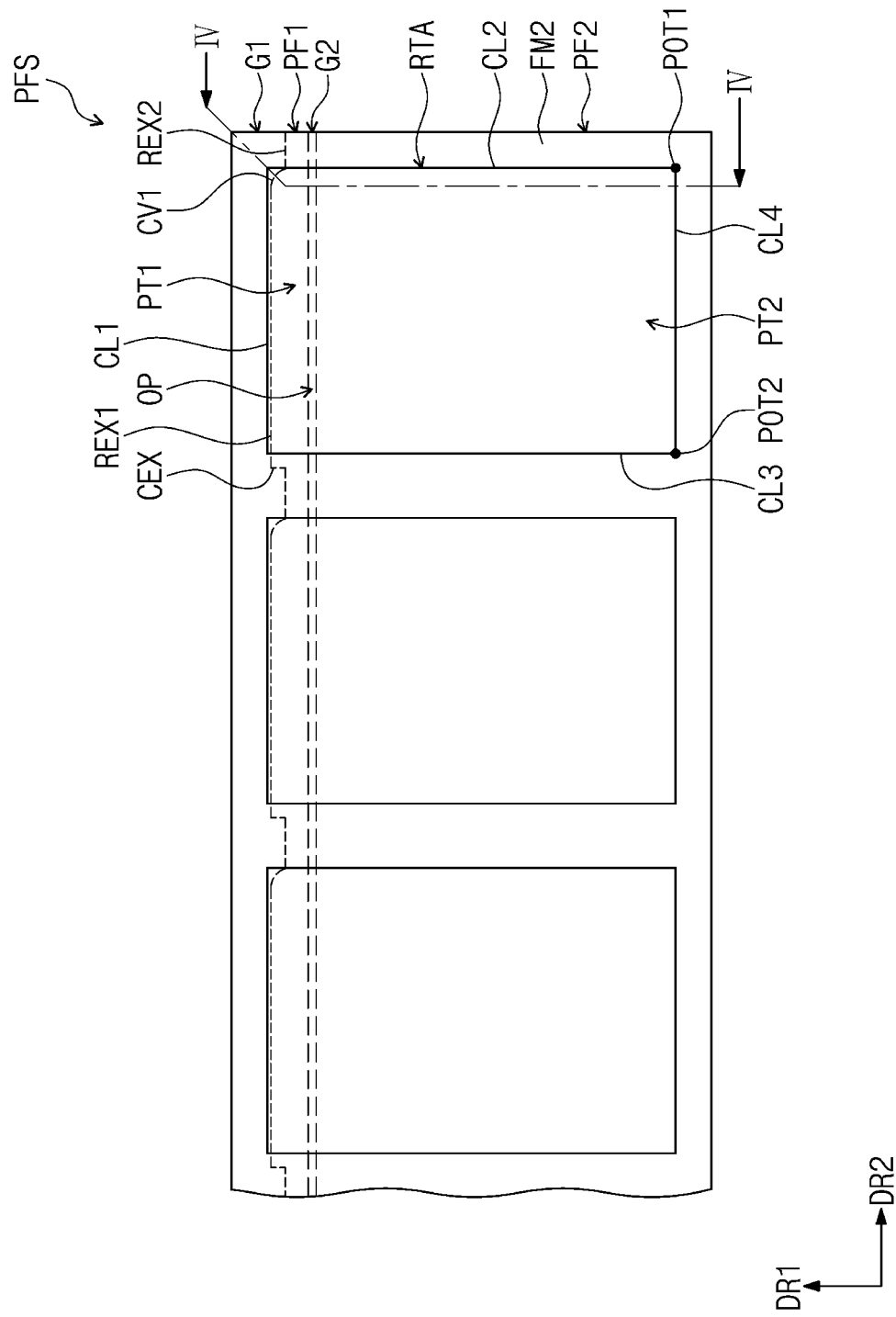

FIG. 21 is a diagram illustrating a planar structure of the protective film sheet PFS provided with the second film FM2.

Referring to FIG. 21, a rectangular region RTA may be defined in the protective film sheet PFS. The rectangular region RTA may include planar areas of a first portion PT1 of the first protective film PF1, a second portion PT2 of the second protective film PF2, and an opening OP which is defined as a portion of the second groove G2 and is disposed between the first portion PT1 and the second portion PT2. In substance, the first portion PT1, the second portion PT2 and the opening OP in FIG. 21 may correspond to the first portion PT1, the second portion PT2 and the opening OP shown in FIG. 3. A rectangular region RTA may correspond to an area of a single protective film PF in a final form provided separately from a display panel DP and attachable thereto.

The first portion PT1 in FIG. 21 may be a portion of the first protective film PF1 of the protective film sheet PFS, and may correspond to the first portion PT1 of a single panel protective film PPF shown in FIG. 2. The second portion PT2 in FIG. 21 may be a portion of the second protective film PF2 of the protective film sheet PFS, and may correspond to the second portion PT2 of the single panel protective film PPF shown in FIG. 2.

A border of the rectangular region RTA within the protective film sheet PFS may correspond to a first cutting line CL1, a second cutting line CL2, a third cutting line CL3, and a fourth cutting line CL4. The first cutting line CL1 may be lengthwise extended along the second direction DR2 to correspond to the first horizontal extension REX1 adjacent to the first groove G1. The first cutting line CL1 may be overlapped with or aligned with the first horizontal extension REX1 or may be disposed spaced apart from the first horizontal extension REX1 by a distance in consideration of a process margin, as shown in FIG. 21.

The second cutting line CL2 may be lengthwise extended along the first direction DR1 from an end of the first cutting line CL1 which is adjacent to the first curvilinear portion CV1. The second cutting line CL2 may be lengthwise extended from the first cutting line CL1 and toward a first point POT1 of the second portion PT2. The second cutting line CL2 may extend through an end of the first curvilinear portion CV1 which is adjacent to the second horizontal extension REX2. One vertex of the rectangular region RTA, which is defined as a connecting portion at a meeting point of the first cutting line CL1 and the second cutting line CL2, may be disposed outside the first curvilinear portion CV1 in the top plan view. That is, the vertex at a meeting point of the first cutting line CL1 and the second cutting line CL2 corresponds to vertices of the first film FM1 and the second film FM2 included in the protective film sheet PFS.

The third cutting line CL3 may be lengthwise extended along the first direction DR1 from an opposite end of the first cutting line CL1 which is adjacent to vertical extension CEX. The third cutting line CL3 may be extended toward a second point POT2 of the second portion PT2. The third cutting line CL3 may extend through a portion of the first horizontal extension REX1 which is spaced apart from the vertical extension CEX along the second direction DR2. That is, a portion of the first horizontal extension REX1 may remain outside of the third cutting line CL3 along the second direction DR2.

The fourth cutting line CL4 may be lengthwise extended from the first point POT1 to the second point POT2. The first point POT1 and the second point POT2 may be located in common on a same line parallel to the second direction DR2. That is, the fourth cutting line CL4 may be lengthwise extended in the second direction DR2.

Using the above-described first cutting line CL1, second cutting line CL2, third cutting line CL3 and fourth cutting line CL4 which respectively correspond to sides of the rectangular region RTA, the panel protective film PPF and the first and second films FM1 and FM2 disposed thereon may be cut along the border of the rectangular region RTA to separate these layers from the protective film sheet PFS including sheet forms of these layers. The panel protective film PPF and the first and second films FM1 and FM2 disposed thereon which are initially separated from the protective film sheet PFS may be a precursor to a manufactured form of the protective film PF described above.

Figure 22:
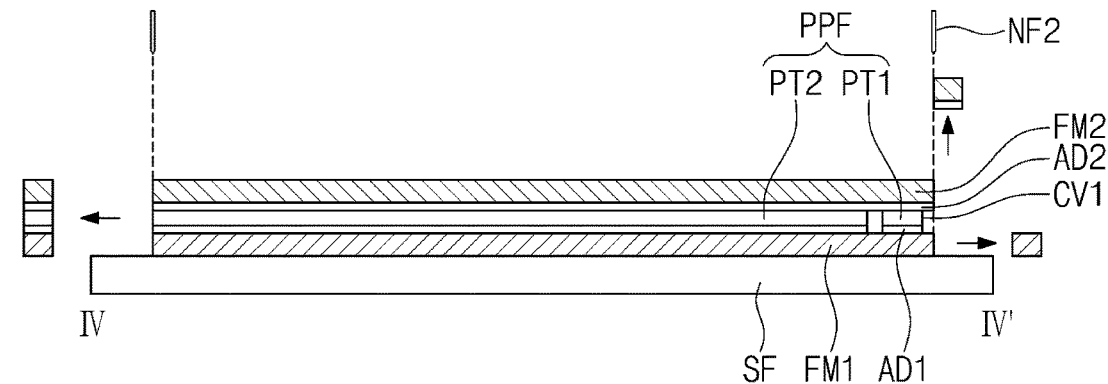
Figure 22:
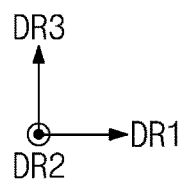
Figure 23:
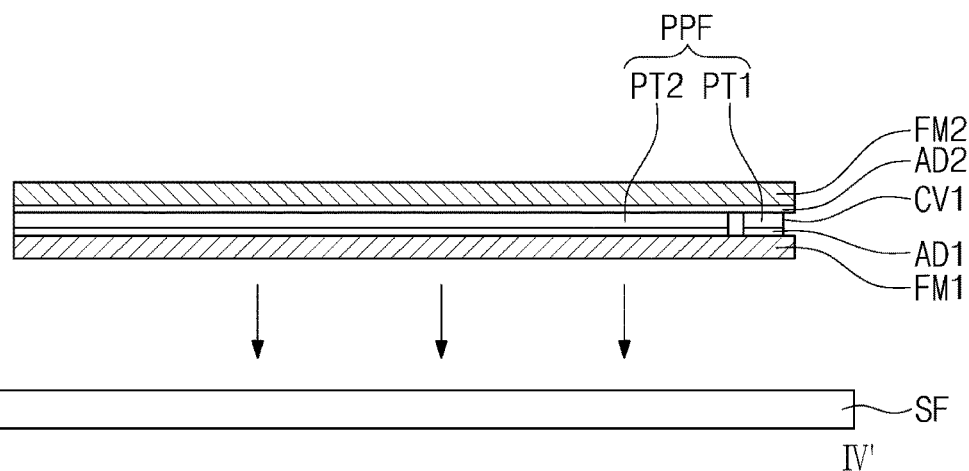
Figure 23:
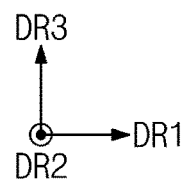

FIG. 22 is a cross-sectional view taken along line IV-IV' of FIG. 21. FIG. 23 is a diagram illustrating a single one of a protective film PF, which is formed by a cutting process performed along borders of the rectangular region RTA shown in FIG. 21.

For convenience in illustration, FIG. 23 is illustrated as a cross-sectional view corresponding to FIG. 22.

Referring to FIG. 22, the panel protective film PPF and the first and second films FM1 and FM2 may be cut together along the first, second, third, and fourth cutting lines CL1, CL2, CL3, and CL4 by a cutting tool such as a knife NF2, to separate portions of each of these layer from the protective film sheet PFS shown in FIG. 21. When the rectangular region RTA is separated from the protective film sheet PFS, the first curvilinear portion CV1 as an edge of the panel protective film PPF may be disposed inside edges of the first and second films FM1 and FM2. The first, second, third, and fourth cutting lines CL1, CL2, CL3, and CL4 used with reference to FIGS. 21 and 22 may corresponding to respective edges of a manufactured protective film PF shown in FIG. 3.

Referring to FIG. 23, the support film SF may be removed from the first film FM1, and as a result, the protective film PF may be manufactured. The manufactured protective film PF may be represented by the protective film PF shown in FIG. 3.

Figure 24:
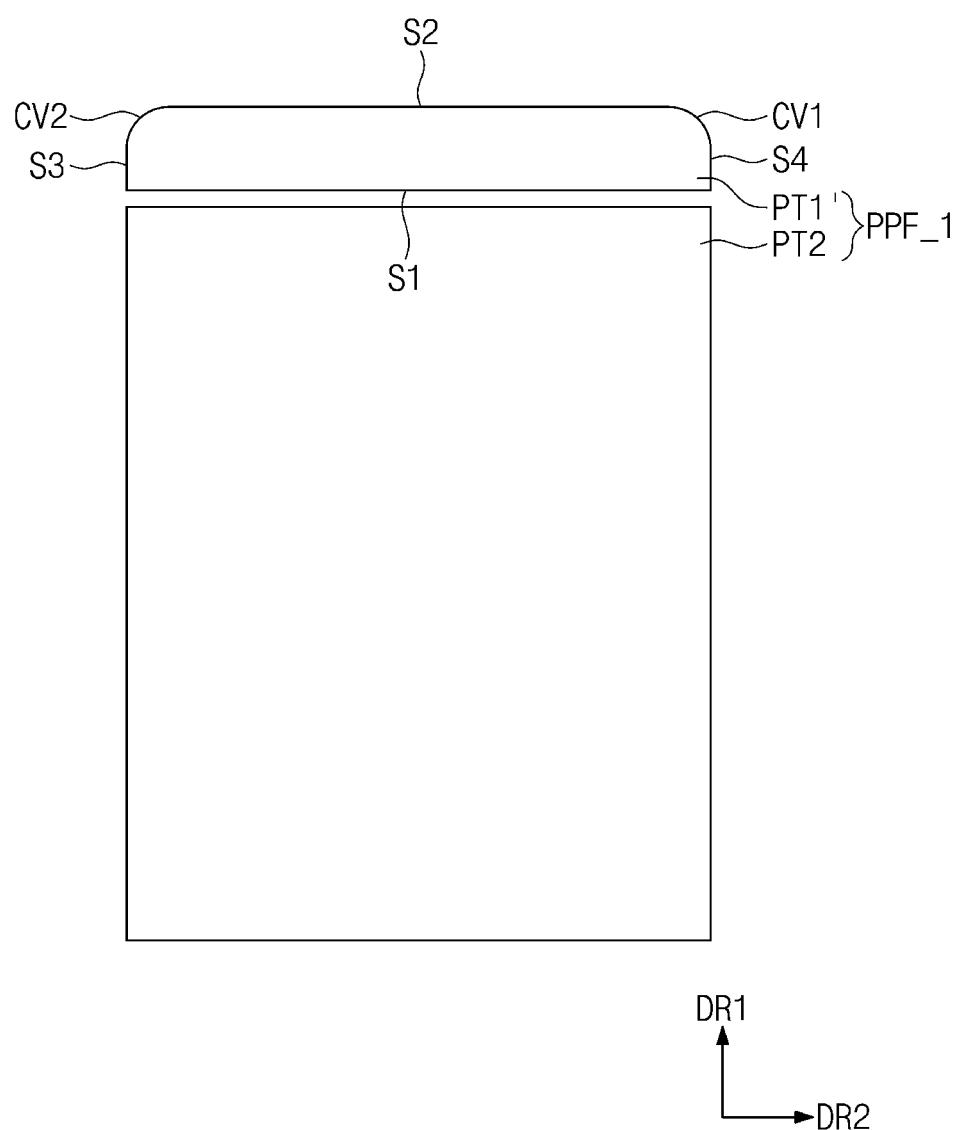
FIG. 24 is a top plan view illustrating another embodiment of a panel protective film according to the invention.

FIG. 24 is a top plan view illustrating another embodiment of a panel protective film according to the invention.

The following description of a panel protective film PPF_1 of FIG. 24 will be focused on different features from the panel protective film PPF shown in FIG. 2. Although not shown, the panel protective film PPF_1 may be disposed between the first film FM1 and the second film FM2, as shown in FIGS. 1 and 3.

Referring to FIG. 24, the panel protective film PPF_1 may include a first portion PT1' and the second portion PT2. The second portion PT2 may have substantially the same structure as the second portion PT2 shown in FIG. 2. In addition, the first to fourth sides S1-S4 and the first curvilinear portion CV1 of the first portion PT1' may be substantially the same as the first to fourth sides S1-S4 and the first curvilinear portion CV1 shown in FIG. 2.

The first portion PT1' may include a second curved edge at a second curvilinear portion CV2 connecting the second side S2 to the third side S3. The second curvilinear portion CV2 may have a convexly curved shape. In an embodiment, for example, the second curvilinear portion CV2 may be symmetric with the first curvilinear portion CV1 and may have a planar shape like a quarter of a circle. However, the invention is not limited to this example, and the second curvilinear portion CV2 may not be symmetric with the first curvilinear portion CV1. The second curvilinear portion CV2 as an edge of the panel protective film PPF_1 may also be disposed inside corresponding vertices of the first and second films FM1 and FM2 adjacent thereto, like the first curvilinear portion CV1 described above for FIG. 2.

The delamination of the first and second films FM1 and FM2 may be started from portions of the first and second films FM1 and FM2 adjacent to the first curvilinear portion CV1 and/or portions of the first and second films FM1 and FM2 adjacent to the second curvilinear portion CV2.

According to an embodiment of the invention, a panel protective film may include a first curvilinear portion which is placed inside edges of first and second films attached to the panel protective film, such that when the first and second films on and under the panel protective film are removed (e.g., delaminated) from the panel protective film, the delamination of the first and second films may start from portions of the first and second films which are outside the first curvilinear portion. Thus, the delamination of the first and second films may be easily executed, and thus, attaching the panel protective film from which the first film and/or the second film has been remove, to a display panel, may be simplified.

While embodiments of the inventions have been particularly shown and described, it will be understood by one of ordinary skill in the art that variations in form and detail may be made therein without departing from the spirit and scope of the attached claims.

What is claimed is:
1. A protective film, comprising:
a first film;
a second film facing the first film;
a panel protective film disposed between the first film and the second film;
a first adhesive agent between the first film and the panel protective film; and
a second adhesive agent between the second film and the panel protective film,
wherein the panel protective film comprises:
a first portion and a second portion spaced apart from each other along a first direction, and
the first portion comprising:
a first side and a second side opposite to each other along the first direction;
a third side and a fourth side opposite to each other along a second direction crossing the first direction; and
a first curvilinear portion connecting the second side to the fourth side, the first curvilinear portion corresponding to first respective corners of the first film and the second film and having a curved shape,
wherein the first side faces the second portion, and the first curvilinear portion is disposed inside edges of the first film and the second film at the first respective corners thereof,
wherein the first and second sides extend in the second direction, and the third and fourth sides extend in the first direction, and
wherein the third and fourth sides overlap sides of the first and second films extending in the first direction, and the second side overlaps sides of the first and second films extending in the second direction.

2. The protective film of claim 1, wherein a first adhesion force between the first film and the first adhesive agent is smaller than a second adhesion force between the panel protective film and the second adhesive agent.

3. The protective film of claim 1, wherein further comprising a releasing agent between the first film and the first adhesive agent, and
the releasing agent is coated on one surface of the first film facing the panel protective film.

4. The protective film of claim 3, wherein the releasing agent comprises silicon or fluorine.

5. The protective film of claim 1, wherein the first adhesive agent is between the first portion and the first film and between the second portion and the first film, and is not disposed on the one surface of the first film, which is overlapped with an opening defined between the first portion and the second portion.

6. The protective film of claim 5, wherein the second adhesive agent is coated on one surface of the second film facing the panel protective film.

7. The protective film of claim 1, wherein the second adhesive agent is between the first portion and the second film, between the second portion and the second film, and overlapped with an opening between the first portion and the second portion.

8. The protective film of claim 1, wherein the first adhesive agent and the second adhesive agent comprise a pressure sensitive adhesive.

9. The protective film of claim 1, wherein a thickness of each of the first film and the second film, is greater than a thickness of the panel protective film.

10. The protective film of claim 1, wherein
the first side and the second side are each extended along the second direction,
the third side and the fourth side are each extended along the first direction, and
the first curvilinear portion has a convexly curved shape.

11. The protective film of claim 1, wherein the first portion further comprises a second curvilinear portion connecting the second side to the third side, the second curvilinear portion corresponding to second respective corners of the first film and the second film.

\* \* \* \* \*